US009125279B2

United States Patent
Sawabe et al.

(10) Patent No.: US 9,125,279 B2
(45) Date of Patent: Sep. 1, 2015

(54) ORGANIC ELECTROLUMINESCENT DEVICE, LUMINAIRE DEVICE, AND METHOD FOR MANUFACTURING ORGANIC ELECTROLUMINESCENT DEVICE

(71) Applicants: Tomoaki Sawabe, Tokyo (JP); Tomio Ono, Kanagawa-ken (JP); Shintaro Enomoto, Kanagawa-ken (JP)

(72) Inventors: Tomoaki Sawabe, Tokyo (JP); Tomio Ono, Kanagawa-ken (JP); Shintaro Enomoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 13/718,493

(22) Filed: Dec. 18, 2012

(65) Prior Publication Data

US 2013/0249384 A1     Sep. 26, 2013

(30) Foreign Application Priority Data

Mar. 24, 2012   (JP) ................................ 2012-068499

(51) Int. Cl.
*H05B 33/12*     (2006.01)
*H01L 51/52*     (2006.01)
*H05B 33/10*     (2006.01)

(52) U.S. Cl.
CPC ............... *H05B 33/12* (2013.01); *H01L 51/524* (2013.01); *H01L 51/5275* (2013.01); *H05B 33/10* (2013.01); *H01L 51/5253* (2013.01); *H01L 51/5259* (2013.01); *H01L 2251/5315* (2013.01); *H01L 2251/5361* (2013.01); *H01L 2251/5369* (2013.01); *H01L 2251/558* (2013.01)

(58) Field of Classification Search
None
See application file for complete search history.

(56) References Cited

U.S. PATENT DOCUMENTS

| | | |
|---|---|---|
| 6,847,163 B1 | 1/2005 | Tsutsui et al. |
| 8,283,858 B2 | 10/2012 | Yonehara et al. |
| 2005/0099120 A1 | 5/2005 | Tsutsui et al. |
| 2006/0038488 A1 | 2/2006 | Fukunaga et al. |
| 2006/0124920 A1 | 6/2006 | Kimura |
| 2006/0125387 A1 | 6/2006 | Adachi et al. |
| 2006/0267483 A1 | 11/2006 | Tsutsui et al. |
| 2012/0161160 A1 | 6/2012 | Tsutsui et al. |

(Continued)

FOREIGN PATENT DOCUMENTS

| | | |
|---|---|---|
| CN | 101232754 A | 7/2008 |
| JP | 2004-39500 A | 2/2004 |

(Continued)

OTHER PUBLICATIONS

Machine translation of JP2008177109 (A)—Jul. 31, 2008; Kazunori.*

(Continued)

*Primary Examiner* — Britt D Hanley
(74) *Attorney, Agent, or Firm* — Oblon, McClelland, Maier & Neustadt, L.L.P.

(57) ABSTRACT

According to one embodiment, an organic electroluminescent device includes a first substrate, a second substrate, a stacked body, and an intermediate layer. The first substrate has a first major surface. The second substrate has a second major surface and a third major surface. The second major surface is facing the first major surface. The third major surface has a first concave-convex portion. The third major surface is provided opposite the second major surface. The stacked body provided between the first substrate and the second substrate. The stacked body includes a first electrode, a second electrode, and an organic light emitting layer. The intermediate layer is provided between the second substrate and the stacked body.

18 Claims, 15 Drawing Sheets

(56) References Cited

U.S. PATENT DOCUMENTS

| | | |
|---|---|---|
| 2012/0228591 A1 | 9/2012 | Sawabe et al. |
| 2012/0241771 A1 | 9/2012 | Kato et al. |

FOREIGN PATENT DOCUMENTS

| | | |
|---|---|---|
| JP | 2006-164808 A | 6/2006 |
| JP | 2007-230075 A | 9/2007 |
| JP | 2008-112844 A | 5/2008 |
| JP | 2008-177109 A | 7/2008 |
| JP | 2009-37745 A | 2/2009 |
| JP | 2010-157424 | 7/2010 |
| JP | 2011-9790 A | 1/2011 |
| JP | 2011-222529 A | 11/2011 |
| WO | WO 2007/008774 A1 | 1/2007 |
| WO | WO 2008/063440 A1 | 5/2008 |
| WO | WO 2012/014629 A1 | 2/2012 |

OTHER PUBLICATIONS

Machine translation of JP2008112844 (A)—May 15, 2008; Hiroshi.*

Office Action issued on Sep. 1, 2014 in the counterpart Japanese Patent Application No. 2012-068499 (with English Translation).

Office Action issued Apr. 25, 2014 in Japanese Patent Application No. 2012-068499 with English language translation.

U.S. Appl. No. 14/045,133, filed Oct. 3, 2013, Ono, et al.

Office Action issued Apr. 9, 2015 in Chinese Patent Application No. 201310060420.4 (with English translation).

Office Action issued May 8, 2015 in Taiwanese Patent Application No. 102104379 (with English translation).

* cited by examiner

ORGANIC ELECTROLUMINESCENT DEVICE, LUMINAIRE DEVICE, AND METHOD FOR MANUFACTURING ORGANIC ELECTROLUMINESCENT DEVICE

CROSS-REFERENCE TO RELATED APPLICATIONS

This application is based upon and claims the benefit of priority from the prior Japanese Patent Application No. 2012-068499, filed on Mar. 24, 2012; the entire contents of which are incorporated herein by reference.

FIELD

Embodiments described herein relate generally to an organic electroluminescent device, a luminaire device, and a method for manufacturing organic electroluminescent device.

BACKGROUND

There is a luminaire device using an organic electroluminescent device for a light source. In the organic electroluminescent device, it is desired to improve luminous efficiency.

DETAILED DESCRIPTION

Figure 1:
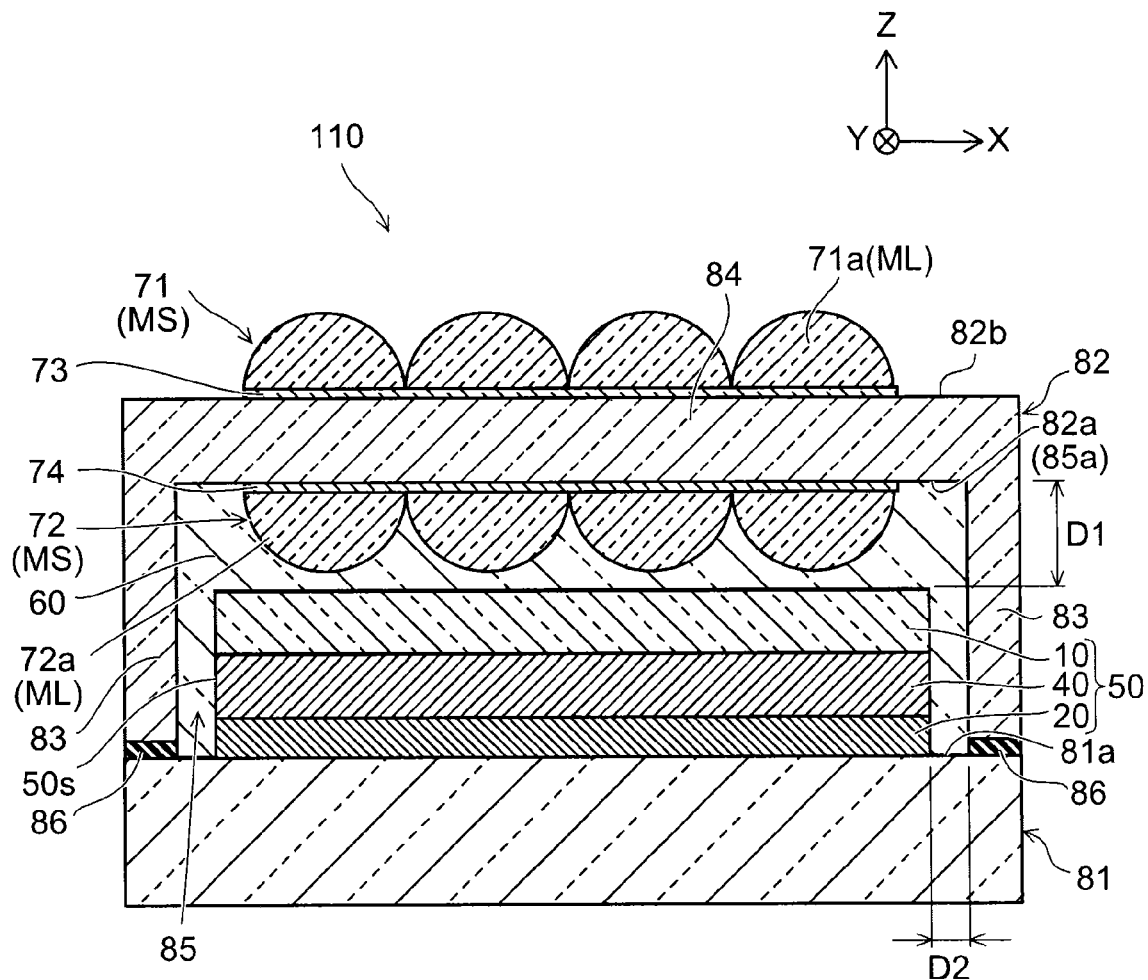
FIG. 1 is a schematic cross-sectional view illustrating the configuration of an organic electroluminescent device according to a first embodiment.

According to one embodiment, an organic electroluminescent device includes a first substrate, a second substrate, a stacked body, and an intermediate layer. The first substrate has a first major surface. The second substrate has a second major surface and a third major surface. The second substrate is light transmissive. The second major surface is facing the first major surface. The third major surface has a first concave-convex portion. The third major surface is provided opposite the second major surface. The stacked body provided between the first substrate and the second substrate. The stacked body includes a first electrode, a second electrode, and an organic light emitting layer. The first electrode is light transmissive. The second electrode is provided between the first substrate and the first electrode. The second electrode is light reflective. The organic light emitting layer is provided between the first electrode and the second electrode. The intermediate layer is provided between the second substrate and the stacked body. An absolute value of a difference between a refractive index of the intermediate layer and a refractive index of the first electrode is smaller than an absolute value of a difference between a refractive index of the second substrate and a refractive index of the first electrode.

According to another embodiment, a luminaire device includes an organic electroluminescent device and a power supply unit. The organic electroluminescent device includes a first substrate, a second substrate, a stacked body, and an intermediate layer. The first substrate has a first major surface. The second substrate has a second major surface and a third major surface. The second substrate is light transmissive. The second major surface is facing the first major surface. The third major surface has a first concave-convex portion. The third major surface is provided opposite the second major surface. The stacked body is provided between the first substrate and the second substrate. The stacked body includes a first electrode, a second electrode, and an organic light emitting layer. The first electrode is light transmissive. The second electrode is provided between the first substrate and the first electrode. The second electrode is light reflective. The organic light emitting layer is provided between the first electrode and the second electrode. The intermediate layer is provided between the second substrate and the stacked body. An absolute value of a difference between a refractive index of the intermediate layer and a refractive index of the first electrode is smaller than an absolute value of a difference between a refractive index of the second substrate and a refractive index of the first electrode. The power supply unit is electrically connected to the first electrode and the second electrode. The power supply unit is configured to supply a current to the organic light emitting layer through the first electrode and the second electrode.

According to another embodiment, a method is disclosed for manufacturing an organic electroluminescent device. The method can include preparing a body to be processed. The body includes a first substrate and a stacked body. The first substrate has a first major surface. The stacked body is provided on the first substrate. The stacked body includes a first electrode, a second electrode, and an organic light emitting layer. The first electrode is light transmissive. The second electrode is light reflective. The second electrode is provided between the first substrate and the first electrode. The organic light emitting layer is provided between the first electrode and the second electrode. The method can include preparing a second substrate. The second substrate has a second major surface and a third major surface. The second substrate is light transmissive. The third major surface has a first concave-convex portion. The third major surface is provided opposite the second major surface. The method can include opposing the second substrate to the body to be processed so as to oppose the second major surface to the first major surface and forming an intermediate layer between the second substrate and the stacked body. An absolute value of a difference between a refractive index of the intermediate layer and a refractive index of the first electrode is smaller than an absolute value of a difference between a refractive index of the second substrate and a refractive index of the first electrode.

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or illustrated in a drawing thereinabove are marked with the identical reference numerals, and a detailed description is omitted as appropriate.

First Embodiment

FIG. 1 is a schematic cross-sectional view illustrating the configuration of an organic electroluminescent device according to a first embodiment.

As shown in FIG. 1, an organic electroluminescent device 110 includes a first substrate 81, a second substrate 82, a stacked body 50, and an intermediate layer 60.

The first substrate 81 has a first major surface 81a. The first substrate 81 is light transmissive, for example. The first substrate 81 is transparent, for example.

Here, suppose that a first direction perpendicular to the first major surface 81a is a Z-axis direction. A direction parallel with the first major surface 81a is taken as an X-axis direction. A direction parallel with the first major surface 81a and perpendicular to the X-axis direction is taken as a Y-axis direction. The X-axis direction and the Y-axis direction are directions perpendicular to the Z-axis direction. The Z-axis direction corresponds to the thickness direction of the first substrate 81.

The second substrate 82 has a second major surface 82a facing the first major surface 81a and a third major surface 82b opposite the second major surface 82a in the Z-axis direction. The second substrate 82 is light transmissive, for example. The second substrate 82 is transparent, for example.

The stacked body 50 includes a first electrode 10, a second electrode 20, and an organic light emitting layer 40.

The first electrode 10 is provided between the first substrate 81 and the second substrate 82. The first electrode 10 is light transmissive. The first electrode 10 is a transparent electrode, for example.

The second electrode 20 is provided between the first substrate 81 and the first electrode 10. The second electrode 20 is light reflective. The light reflectance of the second electrode 20 is higher than the light reflectance of the first electrode 10. In the specification, a state in which the light reflectance of a component is higher than the light reflectance of the first electrode 10 means that the component is light reflective. The light transmittance of the first electrode 10 is higher than the light transmittance of the second electrode 20. In the specification, a state in which the light transmittance of a component is higher than the light transmittance of the second electrode 20 means that the component is light transmissive. For example, the light transmittance of the first substrate 81 and the light transmittance of the second substrate 82 are higher than the light transmittance of the second electrode 20.

The organic light emitting layer 40 is provided between the first electrode 10 and the second electrode 20. In the case where a voltage is applied to the organic light emitting layer 40 through the first electrode 10 and the second electrode 20, for example, the organic light emitting layer 40 recombines an electron with a hole to generate an exciton. The organic light emitting layer 40 emits light using light emission when the excitons emit light and the excitons are deactivated, for example.

In the specification, "being stacked" includes a state in which components are stacked on each other with a different element inserted between the components. In this example, the stacking direction of the stacked body 50 is the Z-axis direction.

The second substrate 82 includes an outer edge portion 83 and an inner side portion 84 on the inner side of the outer edge portion 83. The second major surface 82a is recessed in the inner side portion 84. The second substrate 82 has a recess 85 on the second major surface 82a, for example. The inner side portion 84 is a portion overlapping with the recess 85 when the second substrate 82 is projected onto the first major surface 81a, for example. The outer edge portion 83 is a portion not overlapping with the recess 85 when the second substrate 82 is projected onto the first major surface 81a, for example.

The second substrate 82 is provided on the first major surface 81a, and covers the stacked body 50. At least a part of the outer edge portion 83 opposes a side face 50s of the stacked body 50. A distance D1 between the second major surface 82a and the stacked body 50 along the Z-axis direction is 2 μm or more 500 μm or less, for example. A distance D2 between the outer edge portion 83 and the side face 50s of the stacked body 50 is 5 μm or more and 1,000 μm or less, for example.

A sealing portion 86 is provided between the first substrate 81 and the outer edge portion 83. The second substrate 82 is bonded to the first major surface 81a of the first substrate 81 through the sealing portion 86, for example, so that the stacked body 50 is sealed by the first substrate 81 and the second substrate 82. An ultraviolet cured resin or the like is used for the sealing portion 86, for example.

The second substrate 82 includes a first concave-convex portion 71 and a second concave-convex portion 72.

The third major surface 82b includes a first concave-convex portion 71. The first concave-convex portion 71 is light transmissive. The first concave-convex portion 71 is transparent, for example. The first concave-convex portion 71 includes a plurality of projections and depressions 71a. The first concave-convex portion 71 changes the traveling direction of light emitted from the organic light emitting layer 40 (in the following, referred to as emitted light) with the projections and depressions 71a, for example, and the first concave-convex portion 71 scatters or refracts the emitted light with the projections and depressions 71a, for example, so that the first concave-convex portion 71 suppresses the total reflection of the emitted light on the third major surface 82b, for example.

The projections and depressions 71a are a hemispherical micro lens ML, for example. The first concave-convex portion 71 is a micro lens sheet MS having the micro lenses ML arranged in a matrix configuration, for example. The height of the micro lens ML (the length along the Z-axis direction) is 15 µm (1 µm or more 50 µm or less), for example. Namely, the diameter of the micro lens ML is 30 µm (2 µm or more and 100 µm or less), for example. The shape of the projections and depressions 71a is not limited to the micro lens ML, and may have a given shape. A first adhesive layer 73 is provided between the first concave-convex portion 71 and the second substrate 82. The first concave-convex portion 71 is bonded to the third major surface 82b through the first adhesive layer 73, for example.

The second major surface 82a includes a second concave-convex portion 72. The second concave-convex portion 72 is provided on the inner side portion 84 of the second substrate 82. The second concave-convex portion 72 is provided on a bottom face 85a of the recess 85, for example. The second concave-convex portion 72 is light transmissive. The second concave-convex portion 72 is transparent, for example. The second concave-convex portion 72 includes a plurality of projections and depressions 72a. The second concave-convex portion 72 changes the traveling direction of the emitted light with the projections and depressions 72a, for example, and the second concave-convex portion 72 scatters or refracts the emitted light with the projections and depressions 72a, for example, so that the second concave-convex portion 72 suppresses the total reflection of the emitted light on the second major surface 82a by, for example.

The second concave-convex portion 72 is a micro lens sheet MS substantially the same as the first concave-convex portion 71, for example. The projections and depressions 72a are a micro lens ML substantially the same as the projections and depressions 71a, for example. A second adhesive layer 74 is provided between the second concave-convex portion 72 and the second substrate 82. The second concave-convex portion 72 is bonded to the second major surface 82a through the second adhesive layer 74, for example. The first adhesive layer 73 and the second adhesive layer 74 may be an adhesive that is hardened to exert anti-resistant force, or may be a pressure sensitive adhesive including a liquid or gel solid of high viscosity.

The intermediate layer 60 is provided between the second substrate 82 and the stacked body 50. In this example, the intermediate layer 60 is provided between the second concave-convex portion 72 and the stacked body 50. The intermediate layer 60 is also provided between the outer edge portion 83 of the second substrate 82 and the side face 50s of the stacked body 50. The intermediate layer 60 is filled in a gap between the first major surface 81a and the second major surface 82a, for example. The intermediate layer 60 is light transmissive. The intermediate layer 60 is transparent, for example. The absolute value of the refractive index difference between the refractive index of the intermediate layer 60 and the refractive index of the first electrode 10 is smaller than the absolute value of the refractive index difference between the refractive index of the second substrate 82 and the refractive index of the first electrode 10, and the refractive index of the intermediate layer 60 is close to the refractive index of the first electrode 10, so that the intermediate layer 60 suppresses the total reflection of the emitted light on the surface of the first electrode 10, for example. Namely, in the organic electroluminescent device 110, the intermediate layer 60 can efficiently extract the light contained in the stacked body 50 (the thin film mode) to the intermediate layer 60.

In the case where the diameter of the projections and depressions 72a of the second concave-convex portion 72 is 380 nm or more and less than 780 nm, which is an order of the wavelength visible light, the effect of scattering and refraction is made smaller. For example, the height of the micro lens ML is 1 µm or more 50 µm or less to appropriately obtain the effect of scattering and refraction. Accordingly, the light taken to the intermediate layer 60 can be externally extracted.

There is also a method for forming the projections and depressions 72a using photolithography or the like. However, in the method using photolithography or the like, the structure unit is processed in a so-called thin film process where a film thickness of 10 µm or less is processed. In this case, when the diameter of the projections and depressions 72a is larger than 2 µm, it is necessary to provide thick projections and depressions 72a in a height of about 1 µm in order to form the projections and depressions 72a in an ideal lens shape. In this height, cracks are caused by the internal stress of the thin film, causing a difficulty of processing the projections and depressions 72a. Therefore, it is difficult to stably form the projections and depressions 72a in an appropriate shape. On the contrary, in the configuration in which the micro lens sheet MS is bonded to form the second concave-convex portion 72, the projections and depressions 72a in an appropriate shape can be easily obtained. The first concave-convex portion 71 and the second concave-convex portion 72 are not limited to the micro lens sheet MS. For example, other optical films such as a lenticular lens sheet and a sheet in a lattice shape or in a pyramid structure may be used. The configuration of the first concave-convex portion 71 and the configuration of the second concave-convex portion 72 may be a configuration that can change the traveling direction of the emitted light. The configuration of the first concave-convex portion 71 may be different from the configuration of the second concave-convex portion 72.

In the organic electroluminescent device 110, the emitted light passes through the first electrode 10, the intermediate layer 60, the second concave-convex portion 72, the second substrate 82, and the first concave-convex portion 71, and goes to the outside of the organic electroluminescent device 110. Namely, the organic electroluminescent device 110 is a top emission (top surface emission) light emitting device that emits light to the upper side of the first substrate 81.

In the organic electroluminescent device 110, the intermediate layer 60 suppresses the total reflection of the emitted light on the surface of the first electrode 10. Namely, in the organic electroluminescent device 110, light in the thin film mode can be efficiently extracted to the intermediate layer 60. In the organic electroluminescent device 110, the second concave-convex portion 72 suppresses the total reflection of the emitted light on the second major surface 82a. Accordingly, the light extracted to the intermediate layer 60 can be efficiently converted into an external mode or a substrate mode. In the organic electroluminescent device 110, the first concave-convex portion 71 suppresses the total reflection of the emitted light on the third major surface 82b. Namely, in the organic electroluminescent device 110, light in the substrate mode can also be efficiently extracted. As described above, in the organic electroluminescent device 110, a reduction in light extraction efficiency caused by the total reflection of the emitted light can be suppressed. Accordingly, a high luminous efficiency can be obtained in the organic electroluminescent device 110.

When the distance D1 is smaller than 2 μm, for example, the second concave-convex portion 72 contacts the stacked body 50. When the projections and depressions 72a are formed so as not to contact the stacked body 50 in the case where the distance D1 is smaller than 2 μm, the projections and depressions 72a are too small to obtain the effect of improving light extraction efficiency, for example. On the other hand, when the distance D1 is greater than 500 μm, the thickness of the organic electroluminescent device 110 becomes thick, for example. When the thickness of the organic electroluminescent device 110 (the length along the Z-axis direction) is reduced while increasing the distance D1 greater than 500 μm, the strength of the second substrate 82 is reduced, for example. For this reason, preferably, the distance D1 is 2 μm or more 500 μm or less.

When the distance D2 is smaller than 5 μm, it is difficult to manufacture the organic electroluminescent device 110, for example. On the other hand, when the distance D2 is greater than 1,000 μm, the organic electroluminescent device 110 is increased in vain, for example. For this reason, preferably, the distance D2 is 5 μm or more and 1,000 μm or less.

In the organic electroluminescent device 110, the intermediate layer 60 is also provided between the outer edge portion 83 of the second substrate 82 and the side face 50s of the stacked body 50, so that the organic light emitting layer 40 or the like can be appropriately protected from moisture or the like penetrating from the sealing portion 86, for example. For example, the intermediate layer 60 is provided with the function of a drying agent to capture moisture or oxygen or a sealing function to prevent moisture or oxygen from penetrating. With the provision of the functions, the lifetime of the organic electroluminescent device 110 can be prolonged, for example. The intermediate layer 60 is provided with light scattering properties to extract a part of light in the thin film mode that is not extracted because the light propagates in the horizontal direction.

The intermediate layer 60 is provided to increase the distance of light propagating in the horizontal direction. For example, in the case where Al or Ag is used for the second electrode 20 and the reflectance is about 90%, the light in the thin film mode reflects about ten times in the stacked body 50. The distance of light propagating in the horizontal direction in this case is about a few μm, for example. On the contrary, in the case where the intermediate layer 60 is provided, the distance of light propagating in the horizontal direction can be made about a few 10 μm to a few 100 μm. Therefore, the possibility can be increased that light enters the projections and depressions 72a and is deflected in the case where the pitch of the projections and depressions 72a is large or in the case where the projections and depressions 72a have a grid-like structure, for example. Accordingly, light extraction efficiency can be improved.

Figure 2:
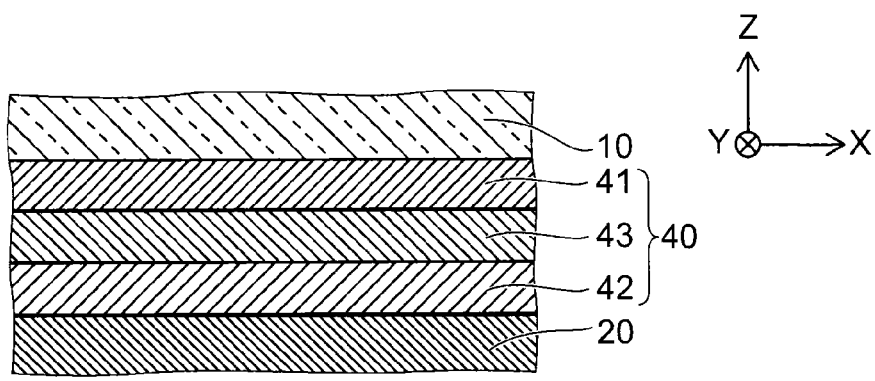
FIG. 2 is a schematic cross-sectional view illustrating the configuration of a part of the organic electroluminescent device according to the first embodiment.

FIG. 2 is a schematic cross-sectional view illustrating the configuration of a part of the organic electroluminescent device according to the first embodiment.

As shown in FIG. 2, the organic light emitting layer 40 includes a light emitting portion 43. The organic light emitting layer 40 can further include at least one of a first layer 41 and a second layer 42 as necessary. The light emitting portion 43 emits light including visible light wavelengths. The first layer 41 is provided between the light emitting portion 43 and the first electrode 10. The second layer 42 is provided between the light emitting portion 43 and the second electrode 20.

For the light emitting portion 43, a material such as $Alq_3$ (tris(8-hydroxyquinolinolato)aluminum), F8BT (poly(9,9-dioctylfluorene-co-benzothiazole), and PPV (polyparaphenylene vinylene) can be used, for example. For the light emitting portion 43, a mixed material of a host material and a dopant doped in the host material can be used. For the host material, CBP (4,4'-N,N'-bis dicarbazolylbiphenyl), BCP (2,9-dimethyl-4,7 diphenyl-1,10-phenanthroline), TPD (2,9-dimethyl-4,7 diphenyl-1,10-phenanthroline), PVK (polyvinyl carbazole), PPT (poly(3-phenylthiophene)), or the like can be used, for example. For the dopant material, FIrpic (iridium (III) bis(4,6-difluorodiphenyl)-pyridinate-N,C2'-picolinate), $Ir(ppy)_3$ (tris(2-phenylpyridine) iridium), FIr6 (bis (2,4-difluorodiphenyl pyridinate)-tetrakis(1-pyrazolyl)borate-iridium (III)), or the like can be used, for example.

The first layer 41 functions as a hole injection layer, for example. The first layer 41 functions as a hole transport layer, for example. The first layer 41 may include a stacked structure of a layer functioning as a hole injection layer and a layer functioning as a hole transport layer, for example. The first layer 41 may include a layer different from a layer functioning as a hole injection layer and a layer functioning as a hole transport layer.

The second layer 42 can include a layer functioning as an electron injection layer, for example. The second layer 42 can include a layer functioning as an electron transport layer, for example. The second layer 42 may include a stacked structure of a layer functioning as an electron injection layer and a layer functioning as an electron transport layer, for example. The second layer 42 may include a layer different from a layer functioning as an electron injection layer and a layer functioning as an electron transport layer. Such a configuration may be possible in which the first electrode 10 is a cathode, the second electrode 20 is an anode, the first layer 41 functions as an electron injection layer or an electron transport layer, and the second layer 42 functions as a hole injection layer or a hole transport layer.

For example, the organic light emitting layer 40 emits light including components at visible light wavelengths. For example, light emitted from the organic light emitting layer 40 is substantially white light. Namely, light emitted from the organic electroluminescent device 110 is white light. Here, "white light" is substantially white color, including white color light such as red, yellow, green, blue, and purple light, for example.

The first electrode 10 includes an oxide including at least one element selected from a group consisting of In, Sn, Zn, and Ti, for example. For the first electrode 10, indium oxide, zinc oxide, tin oxide, an indium tin oxide (ITO: Indium Tin oxide) film, fluorine doped tin oxide (FTO), a film prepared using a conductive glass including indium zinc oxide (NESA or the like, for example), or the like can be used, for example. The first electrode 10 functions as an anode. The refractive index of the first electrode 10 is 1.7 or more 2.2 or less, for example.

The second electrode 20 includes at least one of aluminum and silver, for example. An aluminum film is used for the second electrode 20, for example. An alloy of silver and magnesium may be used for the second electrode 20. Calcium may be doped in this alloy. The second electrode 20 functions as a cathode, for example.

For the first substrate 81, a transparent glass such as silica glass, alkaline glass, and E-glass is used, for example. The first substrate 81 may be a transparent resin such as polyethylene terephthalate, polycarbonate, polymethyl methacrylate, polypropylene, polyethylene, amorphous polyolefin, and a fluorine resin, for example. A light transmissive material, for example, is used for the second substrate 82. For the second substrate 82, a material substantially the same as the first substrate 81 can be used, for example. The refractive index of the first substrate 81 and the refractive index of the second substrate 82 are 1.4 or more 1.7 or less, for example.

For the first concave-convex portion 71, an acrylic resin, an epoxy resin, polyethylene terephthalate, polypropylene, or the like can be used, for example. For the second concave-convex portion 72, a material substantially the same as the material of the first concave-convex portion 71 can be used, for example. The refractive index of the first concave-convex portion 71 and the refractive index of the second concave-convex portion 72 are 1.5 (1.4 or more 1.7 or less), for example.

Figure 3A:
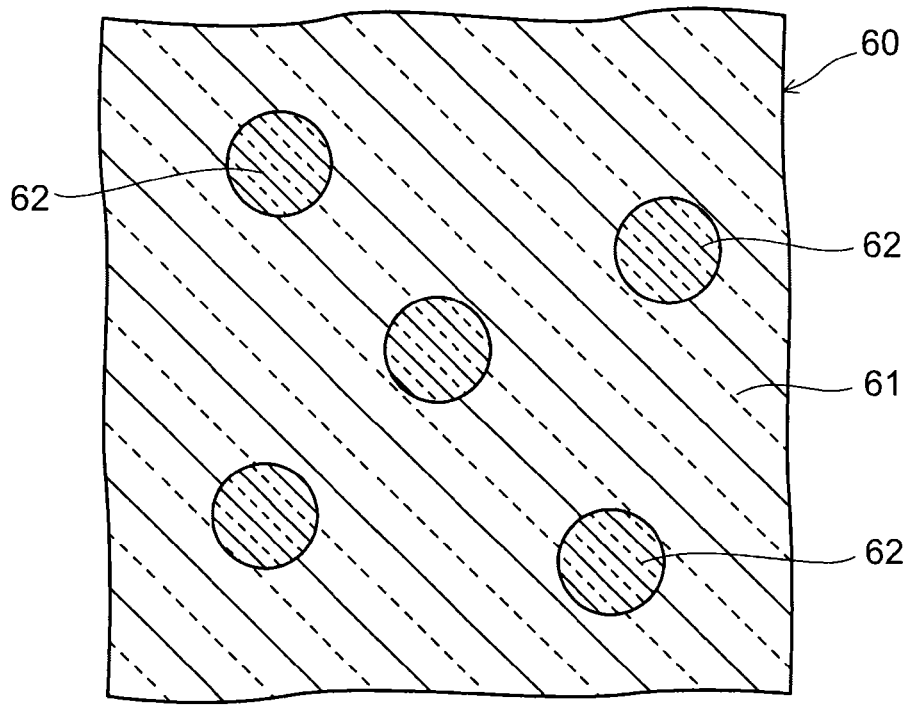
FIG. 3A and FIG. 3B are schematic cross-sectional views illustrating the configuration of a part of the organic electroluminescent device according to the first embodiment.
Figure 3B:
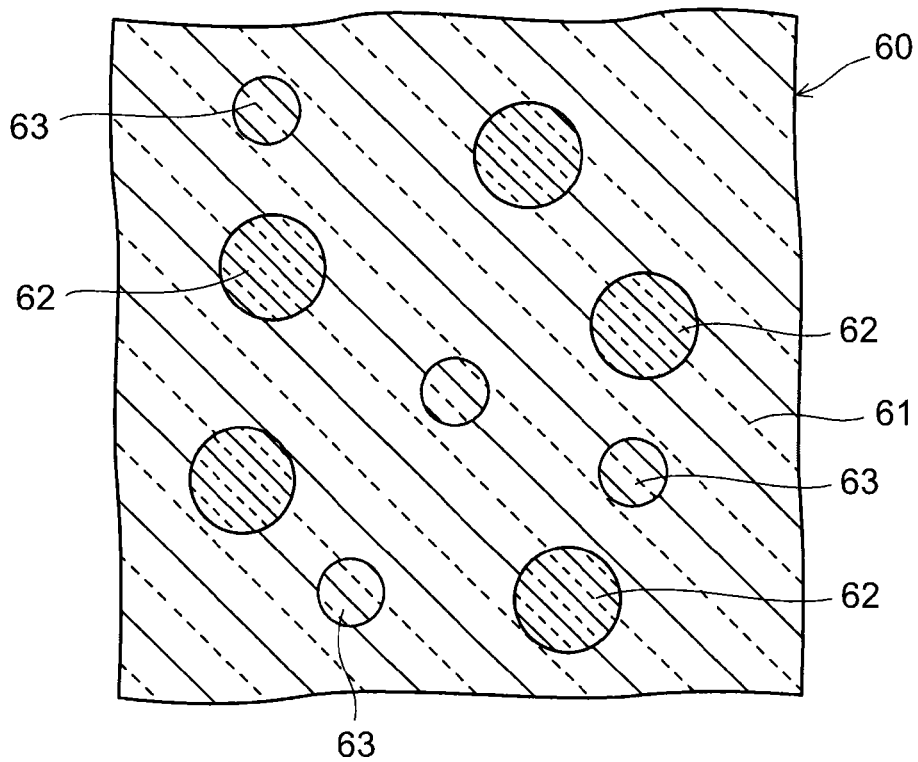

FIG. 3A and FIG. 3B are schematic cross-sectional views illustrating the configuration of a part of the organic electroluminescent device according to the first embodiment.

As shown in FIG. 3A, the intermediate layer 60 includes a resin portion 61 and a plurality of high refractive index particles 62 dispersed in the resin portion 61 and having the refractive index higher than the refractive index of the resin portion 61.

For the resin portion 61, a polymer resin such as an acrylic resin (the refractive index=1.49, for example) and a triazine resin (the refractive index=1.7 to 1.8, for example) is used, for example. For the high refractive index particle 62, titanium oxide (the refractive index=2.7, for example), zirconium dioxide, or the like is used, for example. The refractive index of the intermediate layer 60 is adjusted to 1.7 or more 2.2 or less, for example, by dispersing the high refractive index particles 62 in the resin portion 61, so that the refractive index of the intermediate layer 60 is made close to the refractive index of the first electrode 10. The intermediate layer 60 suppresses the total reflection of the emitted light on the surface of the first electrode 10. For example, an acrylic resin having a refractive index of 1.49 is used for the resin portion 61, and titanium oxide having a refractive index of 2.7 is used for the high refractive index particle 62, where the ratio of the high refractive index particle 62 to the resin portion 61 is 20%, for example, to make the refractive index of the intermediate layer 60 about 1.7. The ratio of the high refractive index particle 62 to the resin portion 61 is 60%, for example, to make the refractive index of the intermediate layer 60 about 2.2.

The configuration of the intermediate layer 60 is not limited to the configuration including the resin portion 61 and the high refractive index particle 62. The intermediate layer 60 may be configured in which the refractive index is 1.7 or more 2.2 or less and the intermediate layer 60 is light transmissive, for example. The intermediate layer 60 may be solid or liquid.

As shown in FIG. 3B, the intermediate layer 60 may further include a plurality of hygroscopic particles 63, for example. The hygroscopic particles 63 are dispersed in the resin portion 61, for example. Calcium oxide, silica, barium oxide, or the like is used for the hygroscopic particles 63, for example. Accordingly, the stacked body 50 can be appropriately protected from moisture, for example.

Figure 4:
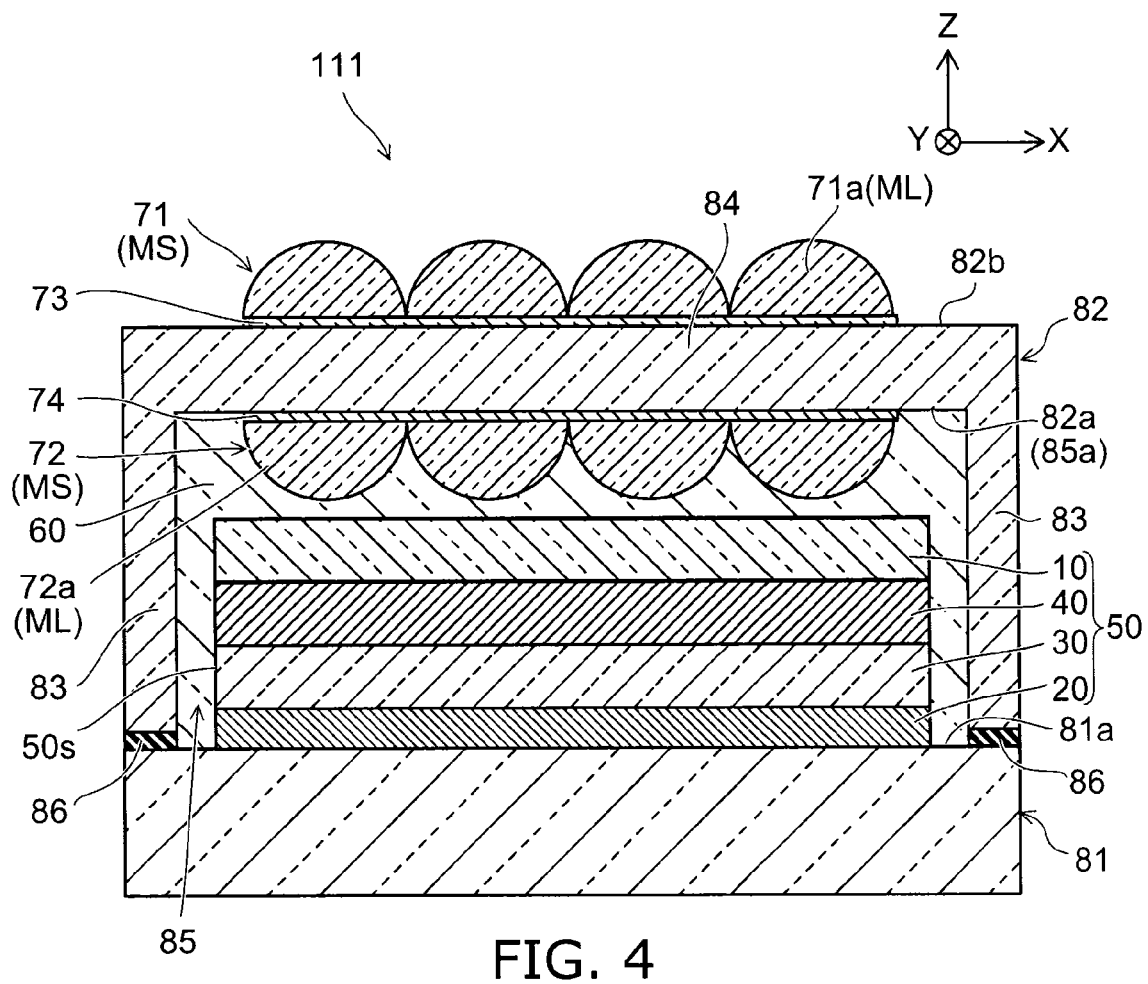
FIG. 4 is a schematic cross-sectional view illustrating the configuration of another organic electroluminescent device according to the first embodiment.

FIG. 4 is a schematic cross-sectional view illustrating the configuration of another organic electroluminescent device according to the first embodiment.

As shown in FIG. 4, a stacked body 50 of an organic electroluminescent device 111 further includes a third electrode 30.

The third electrode 30 is provided between a second electrode 20 and an organic light emitting layer 40. The third electrode 30 is light transmissive. The third electrode 30 is a transparent electrode, for example. A material substantially the same as the material of a first electrode 10 is used for the third electrode 30, for example. The thickness of the third electrode 30 is 10 nm or more and 1,000 nm or less, for example.

The third electrode 30 contacts the second layer 42 functioning as an electron injection layer such as lithium fluoride and cesium fluoride, or functioning as an electron transport layer such as Alq$_3$ and BCP, for example. The third electrode 30 includes lithium or cesium, for example, to facilitate the injection of electrons to the third electrode 30 and the second layer 42, for example. The second layer 42 can include a layer functioning as an electron injection layer such as lithium fluoride and cesium fluoride, for example. The second layer 42 can include a layer functioning as an electron transport layer such as Alq$_3$ and BCP, for example. In the case where the second layer 42 functions as a hole injection layer or a hole transport layer, the third electrode 30 contacts the hole injection layer or the hole transport layer.

In the configuration of the organic electroluminescent device 110 shown in FIG. 1, a part of the emitted light reflects at the second electrode 20, and goes to the outside through the organic light emitting layer 40, the first electrode 10, the intermediate layer 60, and the second substrate 82. In the case where a distance between the organic light emitting layer 40 and the second electrode 20 is about 200 nm or less, a part of the emitted light generated in the organic light emitting layer 40 reaches the second electrode 20 as evanescent waves. When the evanescent waves reach the second electrode 20, surface plasmon resonance occurs if the wave number of the evanescent waves is matched with the wave number of surface plasmon. An electric field generated by surface plasmon resonance stimulates the evanescent waves in the organic light emitting layer 40, and the ratio of the evanescent waves is increased in the emitted light. Propagation light components that can be externally extracted are then reduced in the emitted light. Namely, when surface plasmon resonance occurs, the luminous efficiency of the organic electroluminescent device 110 is reduced.

In the organic electroluminescent device 111, the third electrode 30 such as ITO was provided between the second electrode 20 and the organic light emitting layer 40, where the refractive index of the third electrode 30 was about 1.7 to 2.2, and the extinction coefficient of the third electrode 30 was about 0.001. Therefore, surface plasmon resonance can be suppressed as compared with the case of using a reflective electrode such as Ag for the second electrode 20. The third electrode 30 is provided in a range of 10 nm or more, more preferably, 50 nm or more and 1,000 nm or less to increase a distance between the organic light emitting layer 40 and the second electrode 20, so that the intensity of the evanescent waves reaching the second electrode 20 is attenuated to suppress surface plasmon resonance. Accordingly, a reduction in luminous efficiency due to surface plasmon resonance can be suppressed in the organic electroluminescent device 111, for example.

For a method for suppressing the occurrence of surface plasmon resonance, there is a method in which the thickness of the second layer 42 functioning as an electron injection layer or an electron transport layer, or functioning as a hole injection layer or a hole transport layer is increased, for example. However, in the method for increasing the thickness of the second layer 42, it is likely that a driving voltage and a tact time are increased. In the method for forming the third electrode 30, since a highly conductive thin film is formed by sputtering or the like, a film deposition rate can be increased. An increase in a drive voltage and an increase in tact time can also be suppressed as compared with the method for increasing the thickness of the second layer 42, which is a low conductive organic material formed by vacuum evaporation.

Figure 5:
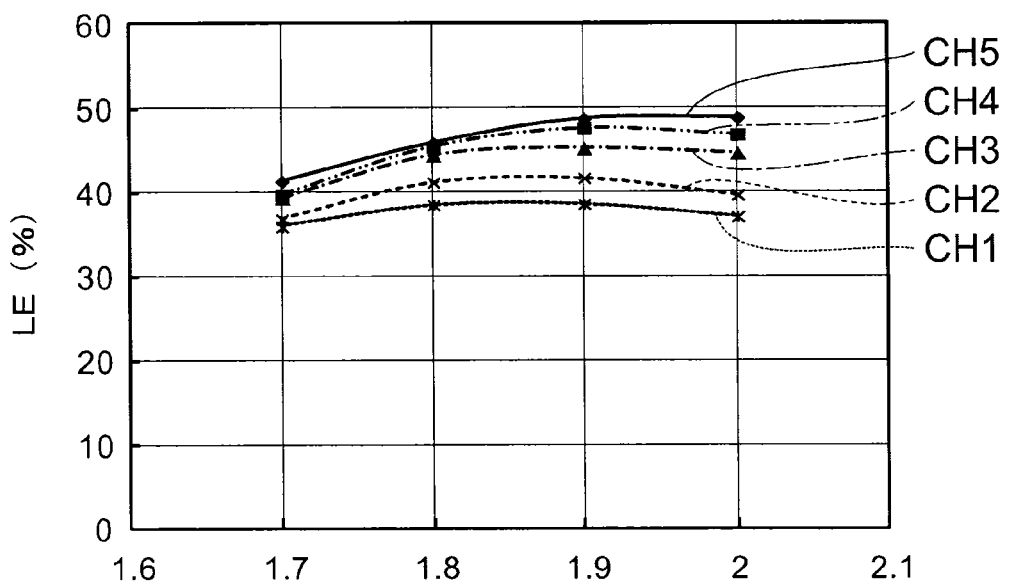
FIG. 5 is a graph illustrating the characteristics of another organic electroluminescent device according to the first embodiment.

FIG. 5 is a graph illustrating the characteristics of another organic electroluminescent device according to the first embodiment.

FIG. 5 is a graph illustrating the result of the ray tracing simulation of the organic electroluminescent device 111. The horizontal axis in FIG. 5 expresses a refractive index n of the intermediate layer 60. The vertical axis expresses a light extraction efficiency LE (%).

In the simulation, the refractive indexes of the second substrate 82, the first concave-convex portion 71, and the second concave-convex portion 72 were 1.5. The refractive index of the intermediate layer 60 was changed in the range of 1.7 to 2.0. In the first concave-convex portion 71 and the second concave-convex portion 72, a micro lens ML having a diameter of 10 μm was the projections and depressions 71a and the projections and depressions 72a. In the simulation, the density (the filling factor) of the micro lens ML when seen from the Z-axis direction was changed. In the simulation, a change in light extraction efficiency was determined in the case where the refractive index of the intermediate layer 60 and the density of the micro lenses ML were changed.

In FIG. 5, a characteristic CH1 expresses the light extraction efficiency LE in the case where the density of the micro lenses ML was 15% and the refractive index n of the intermediate layer 60 was changed. A characteristic CH2 expresses the light extraction efficiency LE in the case where the density of the micro lenses ML was 23% and the refractive index n of the intermediate layer 60 was changed. A characteristic CH3 expresses the light extraction efficiency LE in the case where the density of the micro lenses ML was 40% and the refractive index n of the intermediate layer 60 was changed. A characteristic CH4 expresses the light extraction efficiency LE in the case where the density of the micro lenses ML was 58% and the refractive index n of the intermediate layer 60 was changed. A characteristic CH5 expresses the light extraction efficiency LE in the case where the density of the micro lenses ML was 91% and the refractive index n of the intermediate layer 60 was changed.

FIG. 6A to FIG. 6F are schematic views illustrating the configuration of still another organic electroluminescent device according to the first embodiment.

FIG. 6A to FIG. 6F show an exemplary micro lens ML in which the density when seen from the Z-axis direction is changed.

Figure 6A:
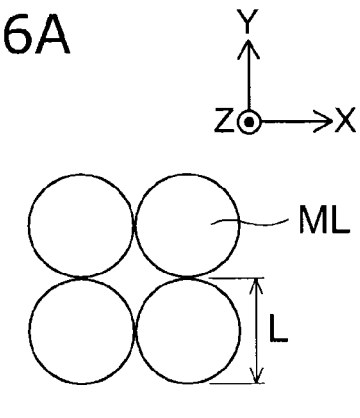
FIG. 6A to FIG. 6F are schematic views illustrating the configuration of still another organic electroluminescent device according to the first embodiment.

FIG. 6A shows a state in which the adjacent micro lenses ML contact with each other in the micro lenses ML arranged in a lattice configuration. Namely, suppose that the diameter of the micro lens ML is L, FIG. 6A shows a state in which a distance between the centers of the micro lenses ML is L. In this configuration, the density of the micro lenses ML per unit area is expressed by $\pi/4$, which is 78.5%.

Figure 6B:
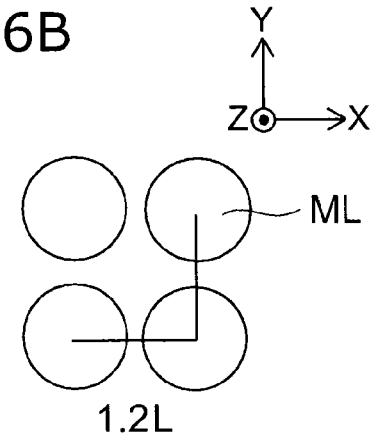

FIG. 6B shows a state in which a distance between the centers of the micro lenses ML is 1.2 L in the micro lenses ML arranged in a lattice configuration. In this configuration, the density of the micro lenses ML per unit area is expressed by $\pi/(4\times1.2^2)$, which is 54.5%.

Figure 6C:
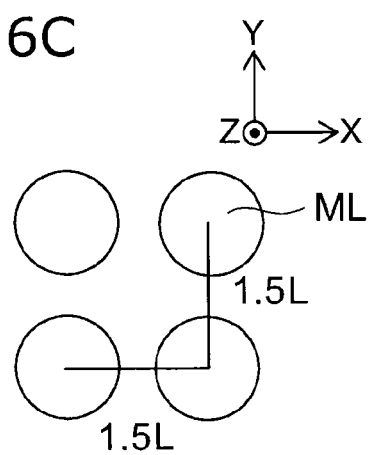

FIG. 6C shows a state in which a distance between the centers of the micro lenses ML is 1.5 L in the micro lenses ML arranged in a lattice configuration. In this configuration, the density of the micro lenses ML per unit area is expressed by $\pi/(4\times1.5^2)$, which is 34.9%.

Figure 6D:
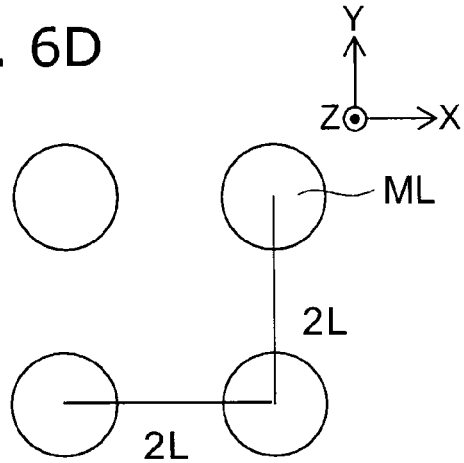

FIG. 6D shows a state in which a distance between the centers of the micro lenses ML is 2 L in the micro lenses ML arranged in a lattice configuration. In this configuration, the density of the micro lenses ML per unit area is expressed by $\pi/16$, which is 19.6%.

Figure 6E:
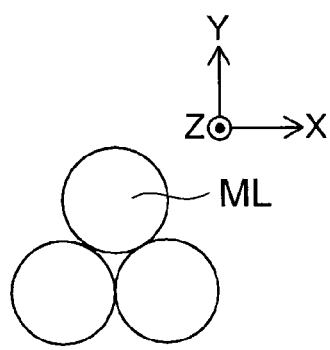

FIG. 6E shows a state in which a distance between the centers of the micro lenses ML is L in the micro lenses ML arranged in a hexagonal close-packed structure. In this configuration, the density of the micro lenses ML per unit area is expressed by $\pi/2\sqrt{3}$, which is 90.6%.

Figure 6F:
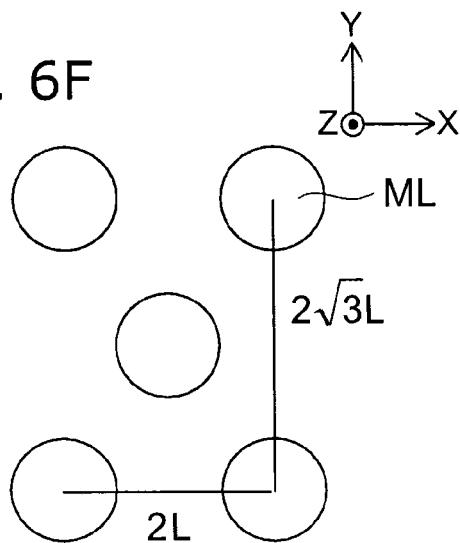

FIG. 6F shows a state in which the micro lenses ML are arranged in a rectangle where a distance between the centers of the micro lenses ML arranged in the X-axis direction is 2 L, a distance between the centers of the micro lenses ML arranged in the Y-axis direction is $2\sqrt{3}$ L, and a single micro lens ML is disposed in the center of the rectangle. In this configuration, the density of the micro lenses ML per unit area is expressed by $\pi/8\sqrt{3}$, which is 22.7%.

Figure 7A:
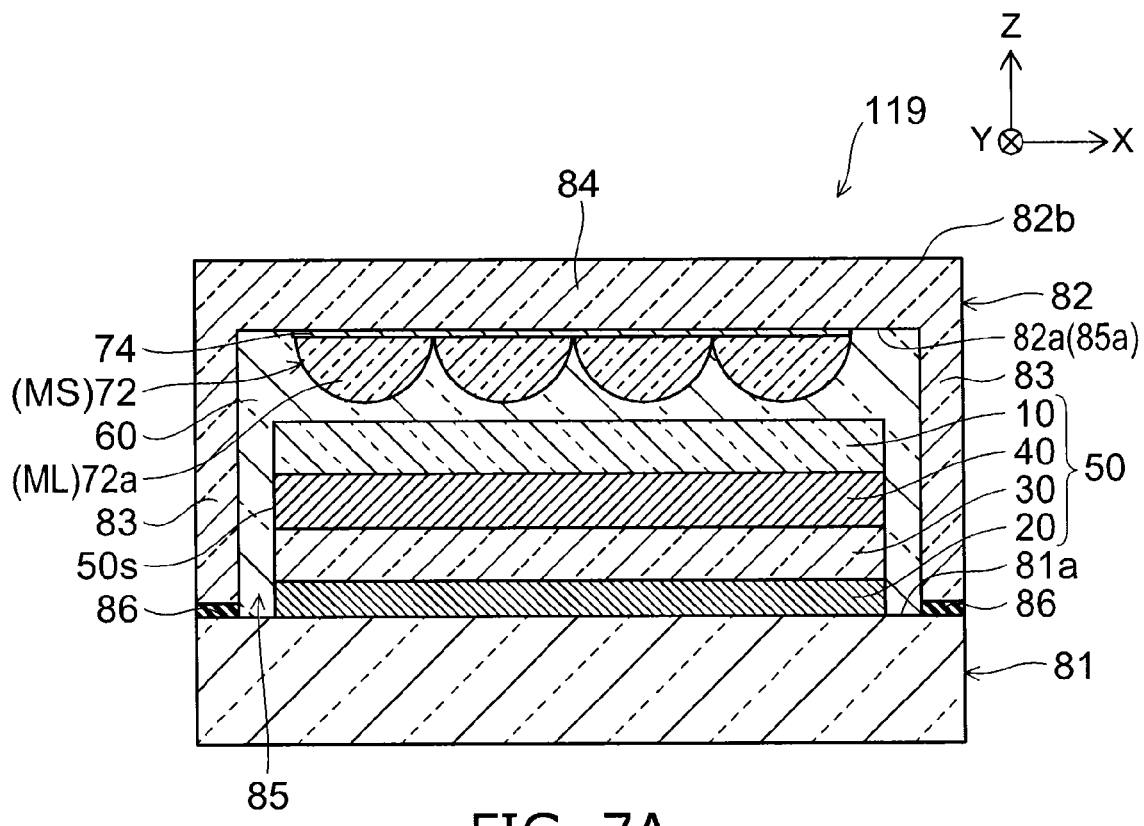
FIG. 7A and FIG. 7B are schematic views illustrating the configuration and characteristics of an organic electroluminescent device according to a reference sample.
Figure 7B:
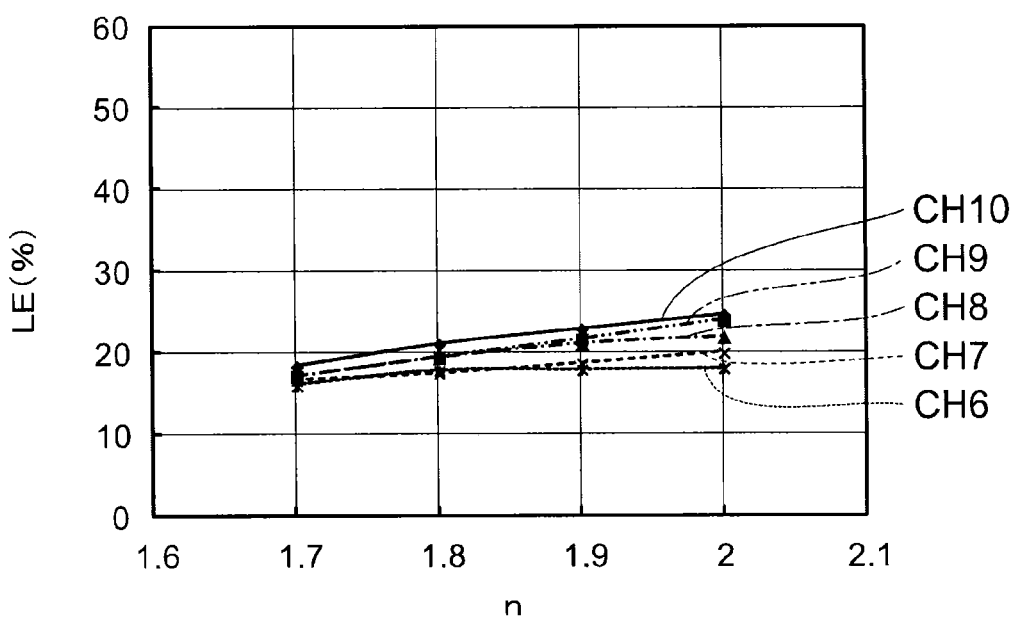

FIG. 7A and FIG. 7B are schematic views illustrating the configuration and characteristics of an organic electroluminescent device according to a reference sample.

FIG. 7A is a schematic cross-sectional view illustrating the configuration of an organic electroluminescent device 119 according to the reference sample. FIG. 7B is a graph illustrating the characteristics of the organic electroluminescent device 119 according to the reference sample. The horizontal axis in FIG. 7B expresses the refractive index n of an intermediate layer 60. The vertical axis expresses the light extraction efficiency LE (%).

As shown in FIG. 7A, the organic electroluminescent device 119 according to the reference sample is configured in which the first concave-convex portion 71 is omitted from the organic electroluminescent device 111.

In the simulation, in the configuration of the organic electroluminescent device 119, a change in light extraction efficiency was also determined in the case of changing the refractive index of the intermediate layer 60 and the density of micro lenses ML.

As shown in FIG. 7B, a characteristic CH6 expresses the light extraction efficiency LE in the case where the density of the micro lenses ML was 15% and the refractive index n of the intermediate layer 60 was changed. A characteristic CH7 expresses the light extraction efficiency LE in the case where the density of the micro lenses ML was 23% and the refractive index n of the intermediate layer 60 was changed. A characteristic CH8 expresses the light extraction efficiency LE in the case where the density of the micro lenses ML was 40% and the refractive index n of the intermediate layer 60 was changed. A characteristic CH9 expresses the light extraction efficiency LE in the case where the density of the micro lenses ML was 58% and the refractive index n of the intermediate layer 60 was changed. A characteristic CH10 expresses the light extraction efficiency LE in the case where the density of the micro lenses ML was 91% and the refractive index n of the intermediate layer 60 was changed.

As shown in FIG. 5 and FIG. 7B, in the organic electroluminescent device 111, the light extraction efficiency LE higher than the light extraction efficiency LE of the organic electroluminescent device 119 was obtained. In both of the organic electroluminescent device 111 and the organic electroluminescent device 119, a higher light extraction efficiency LE was obtained as the density of the micro lenses ML was more increased. From the results of the characteristic CH1 to the characteristic CH5, preferably, the density of the micro lenses ML was 0.4 or more (40% or more). Therefore, an excellent light extraction efficiency LE is obtained. From the results of the characteristic CH1 to the characteristic CH5, preferably, the refractive index n of the intermediate layer 60 was 1.8 or more 2.0 or less. Therefore, an excellent light extraction efficiency LE is obtained.

Figure 8:
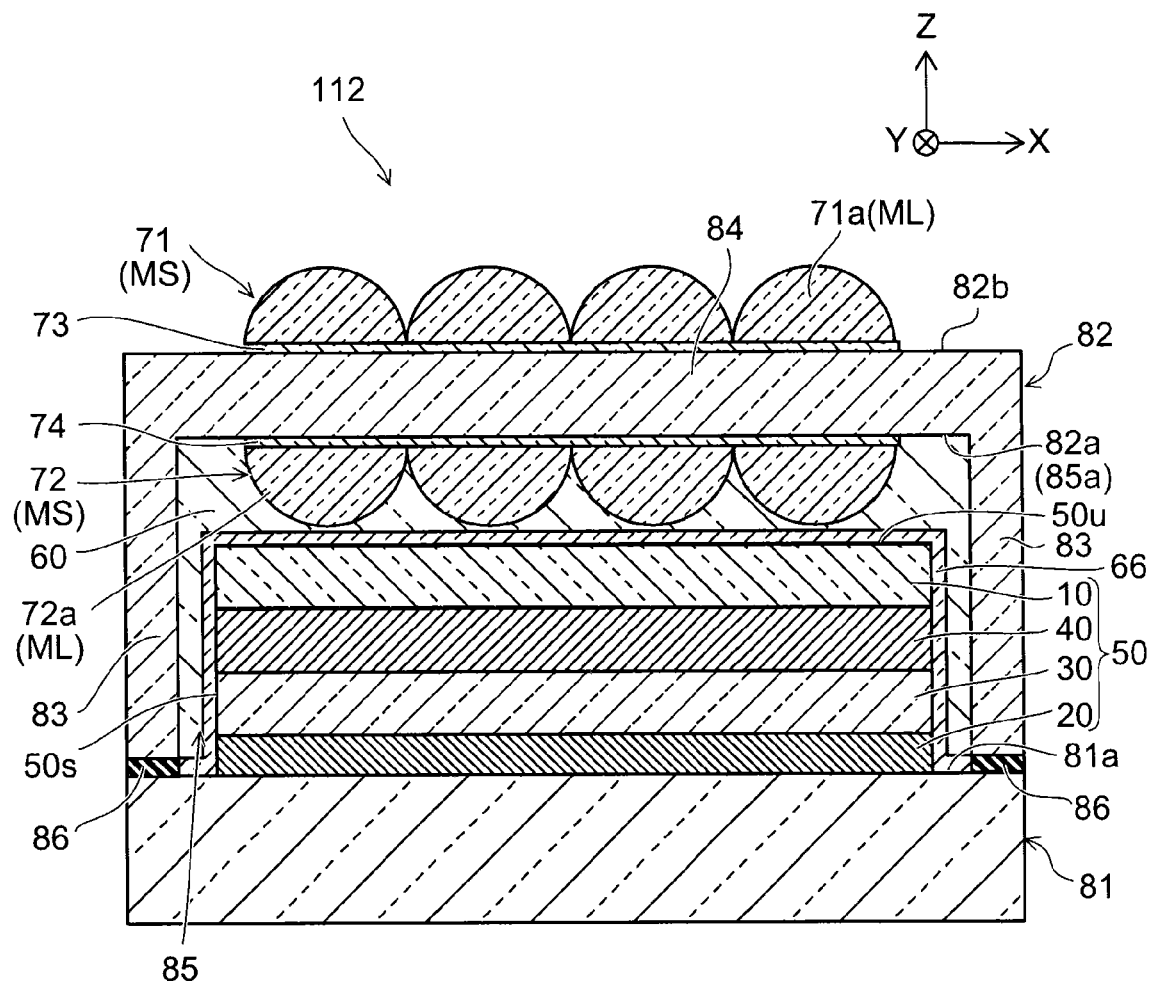
FIG. 8 is a schematic cross-sectional view illustrating the configuration of yet another organic electroluminescent device according to the first embodiment.

FIG. 8 is a schematic cross-sectional view illustrating the configuration of yet another organic electroluminescent device according to the first embodiment.

As shown in FIG. 8, an organic electroluminescent device 112 further includes a protection film 66.

The protection film 66 is provided between a stacked body 50 and an intermediate layer 60. The protection film 66 covers a side face 50s of the stacked body 50 and a top surface 50u of the stacked body 50, for example. A silicon nitride film (SiN) is used for the protection film 66, for example. The protection film 66 is provided to appropriately protect the stacked body 50 from moisture or the like. The refractive index of SiN is 1.8 or more 2.0 or less, for example. The refractive index of SiN is close to the refractive index of a first electrode 10. SiN is used for the protection film 66 to suppress the total reflection between the first electrode 10 and the protection film 66, for example. A reduction in the luminous efficiency of the organic electroluminescent device 112 caused by the protection film 66 can be suppressed, for example. In the case where the protection film 66 is provided, a distance between a second major surface 82a and the protection film 66 is the value D1 recited above. The protection film 66 may be provided in the organic electroluminescent device 110. The material of the protection film 66 is not limited to SiN. The material may be a material having the refractive index close to the refractive index of the first electrode 10. The material may be a stacked film made of a plurality of materials such as an organic material and an inorganic material.

Figure 9:
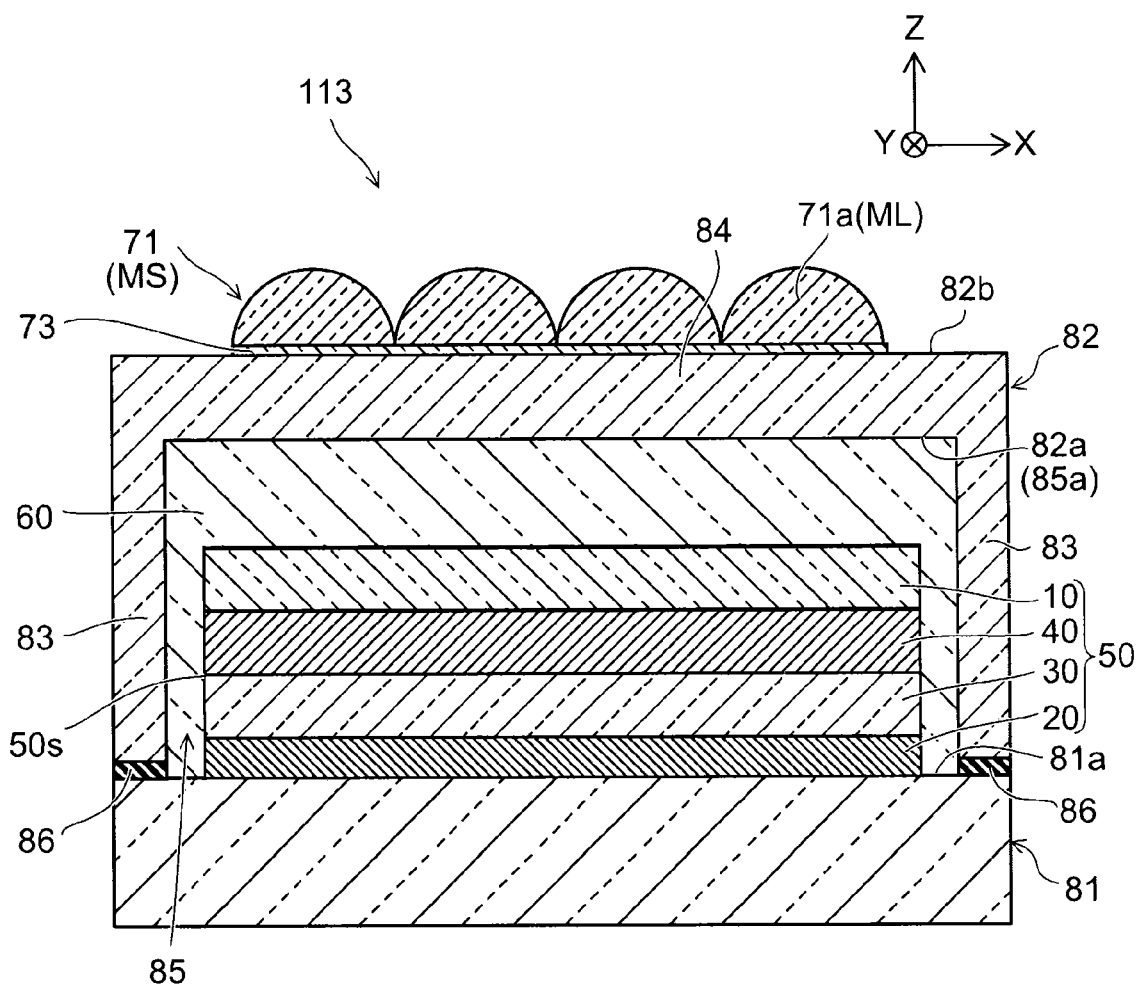
FIG. 9 is a schematic cross-sectional view illustrating the configuration of still yet another organic electroluminescent device according to the first embodiment.

FIG. 9 is a schematic cross-sectional view illustrating the configuration of still yet another organic electroluminescent device according to the first embodiment.

As shown in FIG. 9, in an organic electroluminescent device 113, the second concave-convex portion 72 is omitted. For example, the traveling direction of the emitted light in an intermediate layer 60 can be changed by increasing the concentration or the grain size of a high refractive index particle 62 in the intermediate layer 60. For example, when the grain size is 380 nm to 780 nm or more, which are the orders of visible light wavelengths, the intermediate layer 60 can be provided with scattering properties to the emitted light. In the case where the intermediate layer 60 changes the traveling direction of the emitted light, the intermediate layer 60 can suppress the total reflection of the emitted light on a second major surface 82a. Therefore, for example, in the case where the intermediate layer 60 changes the traveling direction of the emitted light, the second concave-convex portion 72 is not necessarily provided.

Figure 10:
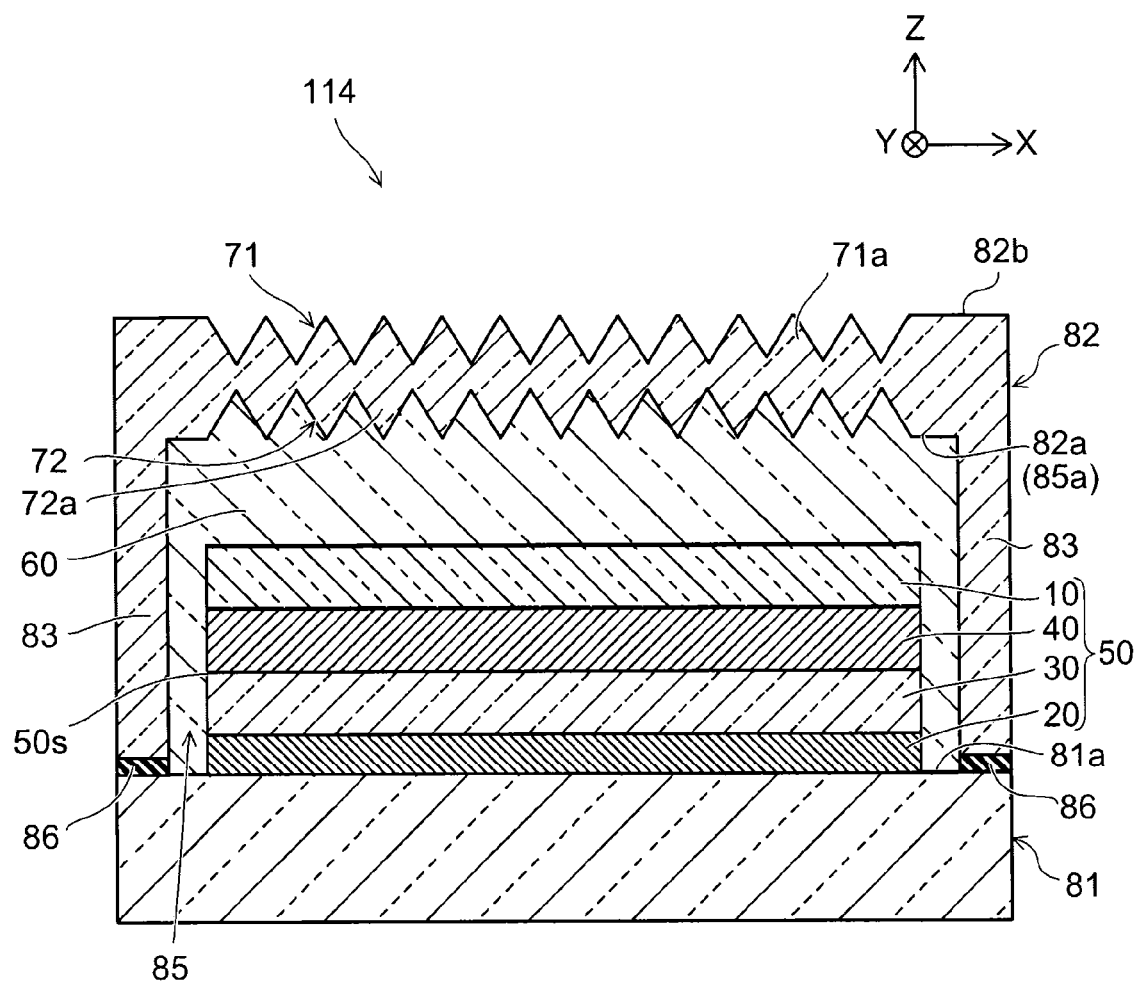
FIG. 10 is a schematic cross-sectional view illustrating the configuration of still another organic electroluminescent device according to the first embodiment.

FIG. 10 is a schematic cross-sectional view illustrating the configuration of still another organic electroluminescent device according to the first embodiment.

As shown in FIG. 10, a third major surface 82b of a second substrate 82 of an organic electroluminescent device 114 has a first concave-convex portion 71. The first concave-convex portion 71 has a plurality of projections and depressions 71a. A second major surface 82a of a second substrate 82 of the organic electroluminescent device 114 has a second concave-convex portion 72. The second concave-convex portion 72 has a plurality of projections and depressions 72a. In this example, the projections and depressions 71a and the projections and depressions 72a are in a pyramid or a prism, for example. The projections and depressions 71a formed on the third major surface 82b can also suppress the total reflection of the emitted light on the third major surface 82b. The projections and depressions 72a formed on the second major surface 82a can also suppress the total reflection of the emitted light on the second major surface 82a. The projections and depressions 71a formed on the third major surface 82b and the projections and depressions 72a formed on the second major surface 82a can be formed by frosting. As described above, the first concave-convex portion 71 may be formed by processing the third major surface 82b, for example. The second concave-convex portion 72 may be formed by processing the second major surface 82a, for example. As similar to the organic electroluminescent device 113, the second concave-convex portion 72 can be omitted.

Figure 11A:
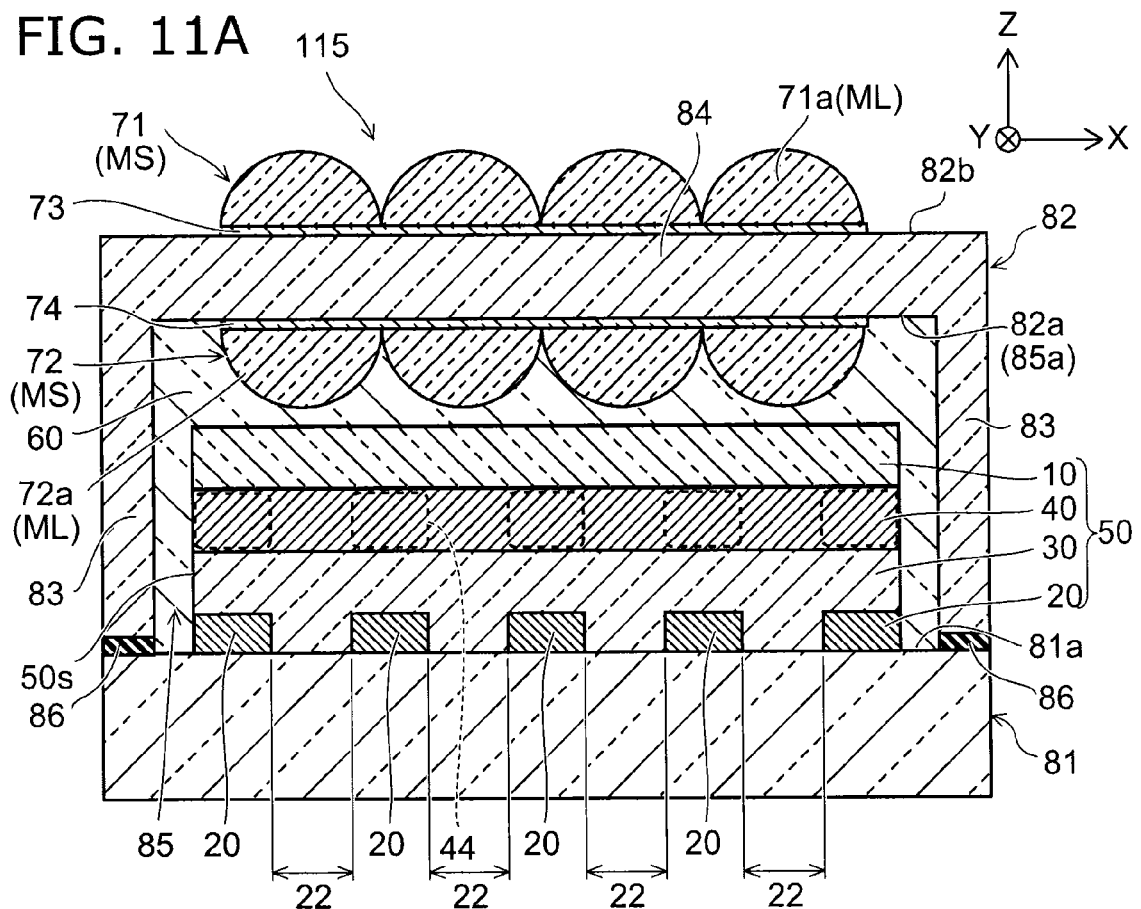
FIG. 11A and FIG. 11B are schematic views illustrating the configuration of yet another organic electroluminescent device according to the first embodiment.
Figure 11B:
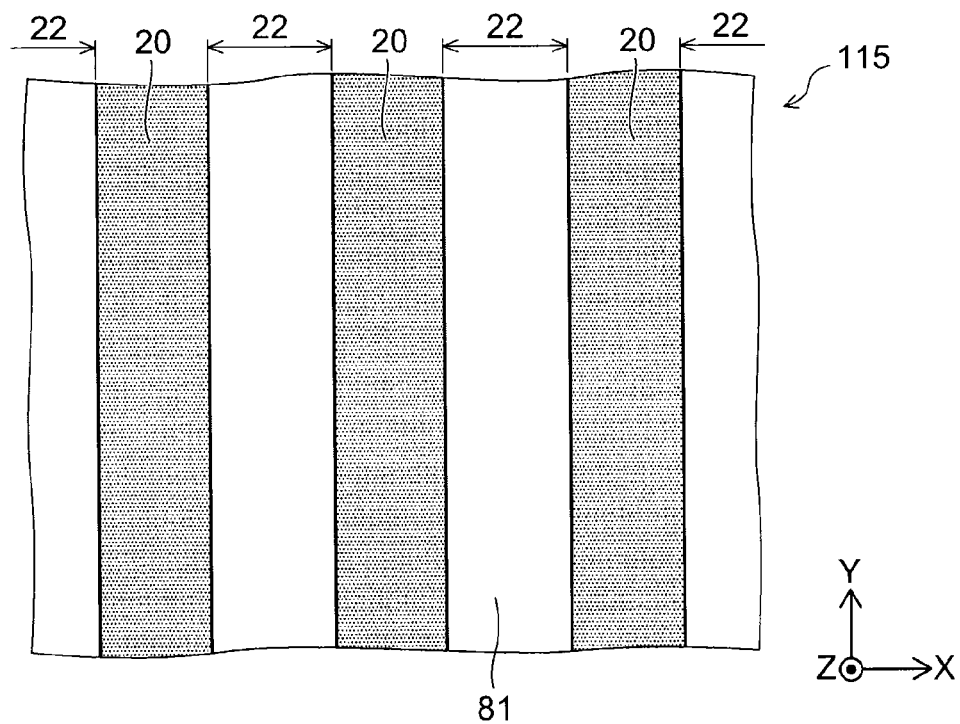

FIG. 11A and FIG. 11B are schematic views illustrating the configuration of yet another organic electroluminescent device according to the first embodiment.

FIG. 11A is a schematic cross-sectional view illustrating the configuration of an organic electroluminescent device 115. FIG. 11B is a schematic plan view illustrating the configuration of a part of the organic electroluminescent device 115.

As shown in FIG. 11A and FIG. 11B, a second electrode 20 of the organic electroluminescent device 115 opposes a part of a first electrode 10. In the organic electroluminescent device 115, a plurality of the second electrodes 20 are provided, for example. An opening 22 is provided between two adjacent second electrodes 20. A plurality of the openings 22 are provided, for example. The openings 22 are individually provided between the second electrodes 20, for example. Namely, the second electrodes 20 are separated from each other.

Each of the second electrodes 20 is in a belt shape extending along the Y-axis direction, for example, and the second electrodes 20 are arranged in the X-axis direction, for example, so that the second electrodes 20 formed in a stripe pattern shape. The distances of the second electrodes 20 are constant, for example. The pattern shape of the second electrodes 20 may be a grid-like structure, for example. The pattern shape of the second electrodes 20 is optional.

In the organic electroluminescent device 115, an organic light emitting layer 40 in the portion where the first electrode 10 opposes the second electrodes 20 is a light emitting region 44. In the organic electroluminescent device 115, light is emitted from the light emitting region 44.

In the organic electroluminescent device 115, external light coming from the outside passes through the second substrate 82, the intermediate layer 60, the first electrode 10, the organic light emitting layer 40, the third electrode 30, the opening 22, and the first substrate 81, for example. As described above, in the organic electroluminescent device 115, the external light externally entering the organic electroluminescent device 115 passes through the components while emits light. As described above, the organic electroluminescent device 115 is light transmissive. The organic electroluminescent device 115 is transparent, for example. In the organic electroluminescent device 115, a background image can be visually recognized through the organic electroluminescent device 115. Namely, the organic electroluminescent device 115 is a see-through light source in a thin film shape or in a plate shape. In the case where the organic electroluminescent device 115 is applied to a luminaire device, various new applications are made possible by a function to transmit background images in addition to the lighting function.

In the configuration of the organic electroluminescent device 115, for example, before forming the organic light emitting layer 40, the second electrode 20 can be formed on the first substrate 81. In the configuration in which the second electrode 20 is formed on the organic light emitting layer 40, it is likely that the organic light emitting layer 40 is adversely affected by etching or the like in patterning the second electrode 20, for example. For this reason, in the configuration in which the second electrode 20 is formed on the organic light emitting layer 40, it is difficult to form the second electrode 20 in high definition because of the restriction on patterning the second electrode 20. On the contrary, in the configuration of the organic electroluminescent device 115, patterning the second electrode 20 will not adversely affect the organic light emitting layer 40. Therefore, in the configuration of the organic electroluminescent device 115, for example, the second electrode 20 can be formed in high definition. The third electrode 30 and the second concave-convex portion 72 can be omitted. The protection film 66 may be provided on the stacked body 50. The shape of the organic electroluminescent device 114 may be used for the first concave-convex portion 71 and the second concave-convex portion 72.

Figure 12:
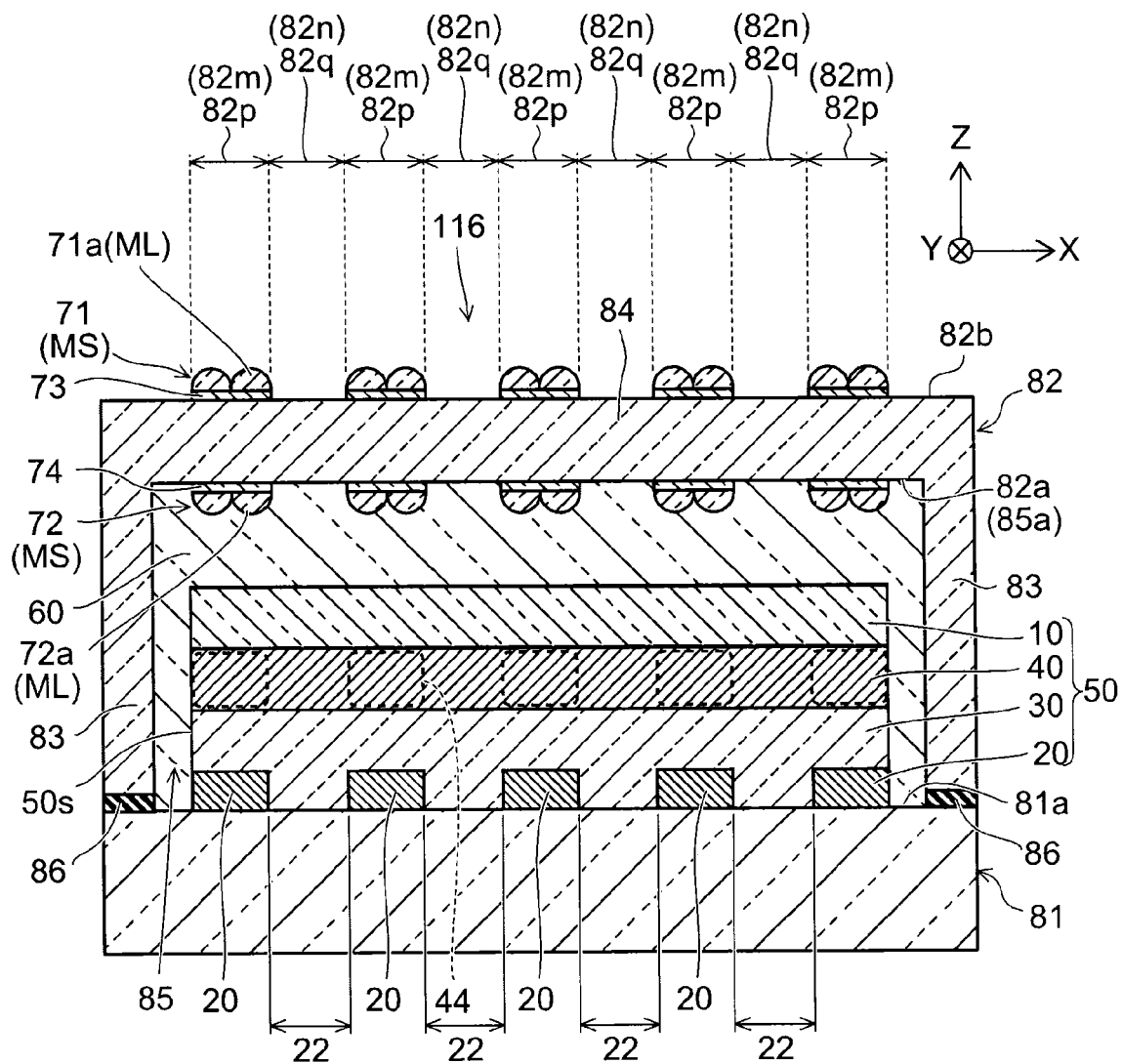
FIG. 12 is a schematic cross-sectional view illustrating the configuration of still yet another organic electroluminescent device according to the first embodiment.

FIG. 12 is a schematic cross-sectional view illustrating the configuration of still yet another organic electroluminescent device according to the first embodiment.

As shown in FIG. 12, a first concave-convex portion 71 of an organic electroluminescent device 116 is provided only on the portion opposing a light emitting region 44 on a third major surface 82b. The third major surface 82b has a first portion 82p overlapping with a plurality of second electrodes 20 and a second portion 82q not overlapping with the second electrodes 20 when projected onto a plane parallel with a first major surface 81a (the X-Y plane). The first concave-convex portion 71 is provided on the first portion 82p. In this example, for example, a plurality of the first portions 82p are provided, and a plurality of the first concave-convex portions 71 are individually provided on the first portions 82p. Namely, the first concave-convex portion 71 is formed in substantially the same pattern shape as the pattern shape of the second electrode 20. In this example, the first concave-convex portion 71 is formed in a stripe pattern shape, for example. A second concave-convex portion 72 of the organic electroluminescent device 116 is provided only on the portion opposing the light emitting region 44 on a second major surface 82a. The second major surface 82a has third portions 82m individually overlapping with the second electrodes 20 and fourth portions 82n not overlapping with the second electrodes 20 when projected onto the X-Y plane. The second concave-convex portion 72 is provided on the third portions 82m. In this example, for example, the third portions 82m are provided, and the second concave-convex portions 72 are individually provided on the third portions 82m. As similar to the first concave-convex portion 71, the second concave-convex portion 72 is formed in a stripe pattern shape substantially the same as the pattern shape of the second electrode 20, for example.

In the configuration of the organic electroluminescent device 115, the traveling direction of passing external light is changed at the first concave-convex portion 71 and the second concave-convex portion 72. For this reason, in the configuration of the organic electroluminescent device 115, transparency is reduced. On the other hand, in the organic electroluminescent device 116, at least a part of external light passes through the second major surface 82a where the first concave-convex portion 71 is not provided and passes through the third major surface 82b were the second concave-convex portion 72 is not provided, the traveling direction of the passing external light is not substantially changed at the second major surface 82a, and the traveling direction of the passing external light is not substantially changed at the third major surface 82b, so that a high transparency is obtained in the organic electroluminescent device 116, for example. For example, the transparency of the organic electroluminescent device 116 is higher than the transparency of the organic electroluminescent device 115.

Figure 13:
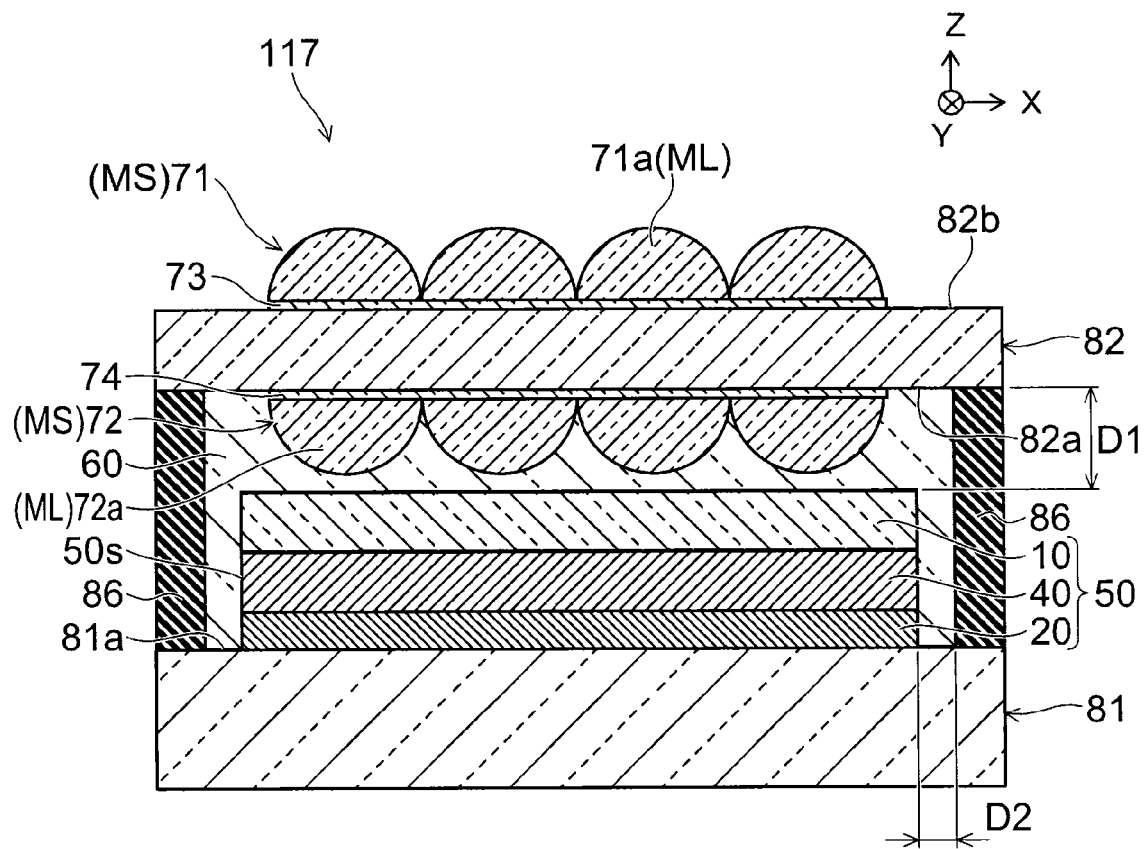
FIG. 13 is a schematic cross-sectional view illustrating the configuration of still another organic electroluminescent device according to the first embodiment.

FIG. 13 is a schematic cross-sectional view illustrating the configuration of still another organic electroluminescent device according to the first embodiment.

As shown in FIG. 13, a second substrate 82 of an organic electroluminescent device 117 is in a plate shape or in a thin film shape, for example. In the organic electroluminescent device 117, the second substrate 82 does not have a recess 85 in a second major surface 82a. In the organic electroluminescent device 117, the second major surface 82a is substantially flat, for example. In the organic electroluminescent device 117, a distance between a first substrate 81 and the second substrate 82 in the Z-axis direction is defined by a sealing portion 86. This configuration can be implemented by including grain spacers (not shown) in the sealing portion 86, for example. For example, the grain spacers are dispersed in the sealing portion 86 to define the distance between the first substrate 81 and the second substrate 82a by the diameter of the spacers.

In the organic electroluminescent device 117, the side face of an intermediate layer 60 is covered with the sealing portion 86. In the organic electroluminescent device 117, the thickness of the sealing portion 86 (the length along the Z-axis direction) is 5 μm or more and 100 μm or less, for example, more preferably, for example, 10 μm or more 20 μm or less. Accordingly, the penetration of moisture or the like can be suppressed, for example. The thickness of the sealing portion 86 is substantially the same as the diameter of the spacer to be dispersed in the sealing portion 86, for example.

The thickness of the organic electroluminescent device 117 is 100 μm or more 5,000 μm or less, for example. Thus, in the organic electroluminescent device 117, a distance D1 between the second major surface 82a and the stacked body 50 is 4 μm or more 99 μm or less, for example, more preferably, 9 μm or more 19 μm or less. Accordingly, the penetration of moisture or the like can be suppressed, for example.

Like the organic electroluminescent device 117, the second substrate 82 may be in a plate shape or in a thin film shape. Also in the organic electroluminescent device 117, a high luminous efficiency can be obtained.

Second Embodiment

Figure 14:
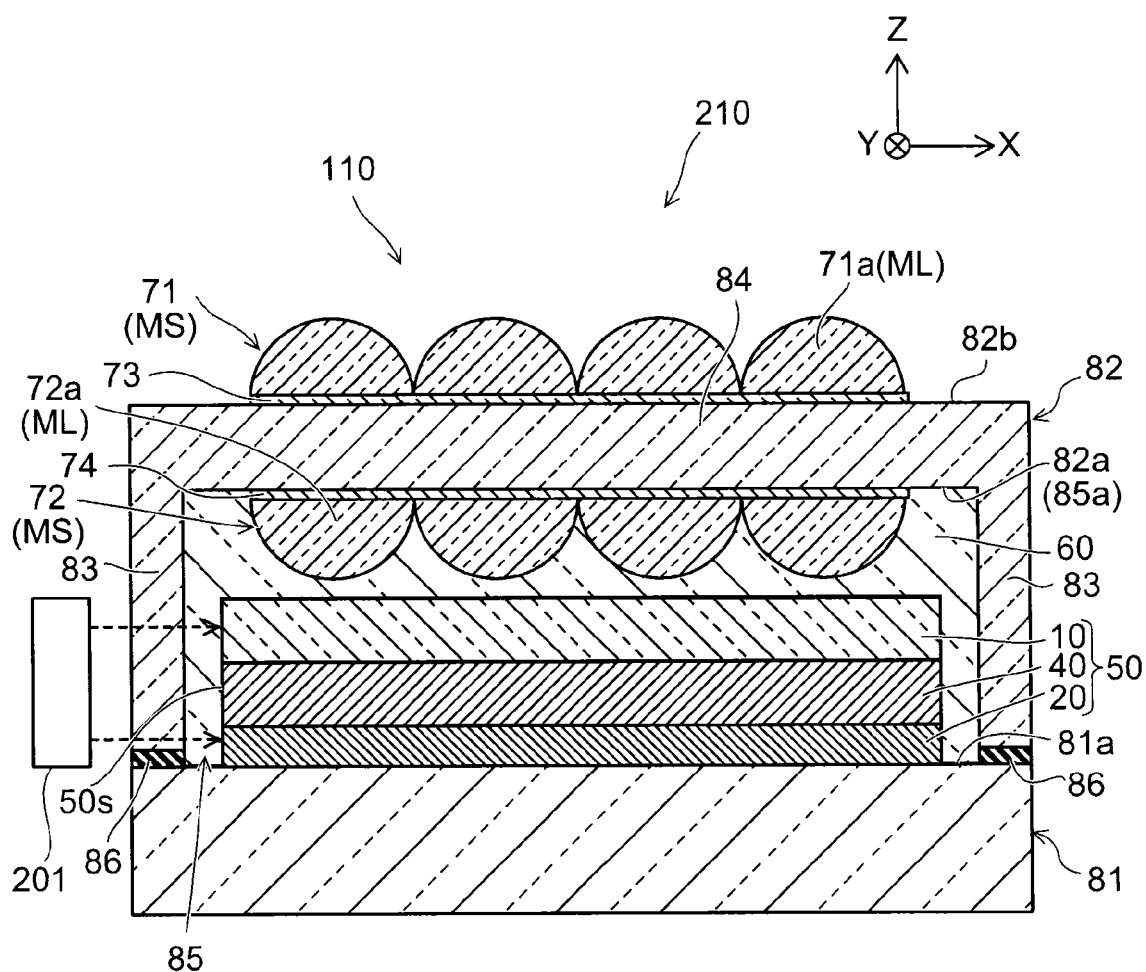
FIG. 14 is a schematic view illustrating the configuration of a luminaire device according to a second embodiment.

FIG. 14 is a schematic view illustrating the configuration of a luminaire device according to a second embodiment.

As shown in FIG. 14, a luminaire device 210 according to the embodiment includes the organic electroluminescent device according to the first embodiment (for example, the organic electroluminescent device 110) and a power supply unit 201.

The power supply unit 201 is electrically connected to the first electrode 10 and the second electrode 20. The power supply unit 201 supplies a current to the organic light emitting layer 40 through the first electrode 10 and the second electrode 20.

In accordance with the luminaire device 210 according to the embodiment, a luminaire device with a high luminous efficiency can be obtained.

Third Embodiment

A third embodiment relates to a method for manufacturing the organic electroluminescent device. The embodiment corresponds to a part of a method for manufacturing the luminaire device.

Figure 15A:
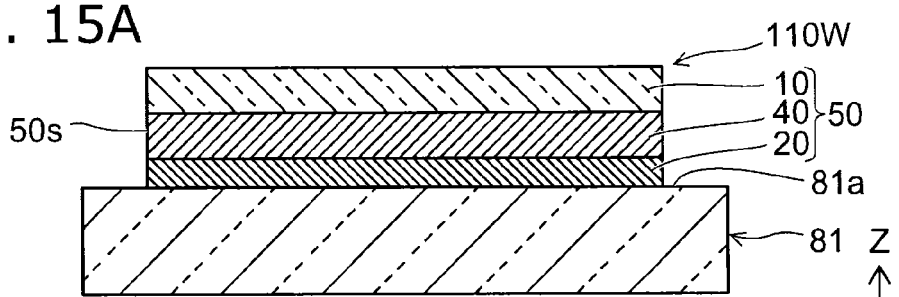
FIG. 15A to FIG. 15C are schematic cross-sectional views illustrating the process steps of the method for manufacturing the organic electroluminescent device according to the third embodiment.
Figure 15B:
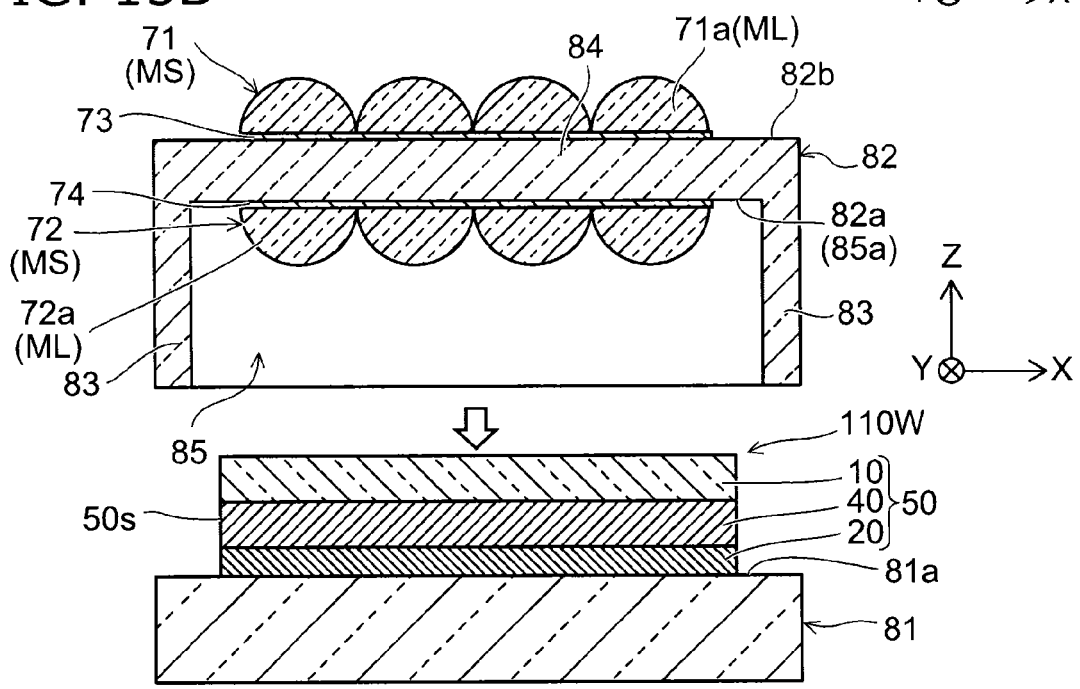
Figure 15C:
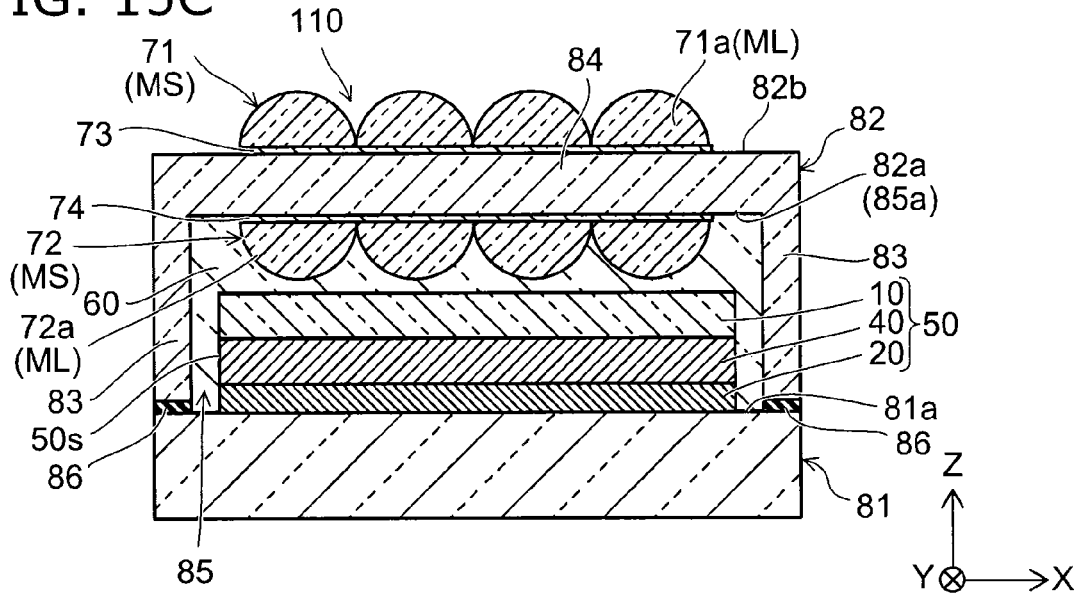

FIG. 15A to FIG. 15C are schematic cross-sectional views illustrating the process steps of the method for manufacturing the organic electroluminescent device according to the third embodiment.

As shown in FIG. 15A, the second electrode 20 is formed on the first major surface 81a of the first substrate 81, for example. The organic light emitting layer 40 is formed on the second electrode 20, the first electrode 10 is formed on the organic light emitting layer 40, and the stacked body 50 is formed on the first major surface 81a. For example, the stacked body 50 is formed on the first major surface 81a to prepare a body 110w to be processed including the first substrate 81 and the stacked body 50.

As shown in FIG. 15B, the second substrate 82 is prepared other than the first substrate 81. The recess 85 is formed on the second major surface 82a of the second substrate 82 by etching or the like, for example. The micro lens sheet MS is bonded on the third major surface 82b of the second substrate 82 through the first adhesive layer 73, for example, to form the first concave-convex portion 71. The micro lens sheet MS is bonded to the second major surface 82a of the second substrate 82 through the second adhesive layer 74, for example, to form the second concave-convex portion 72. In method for bonding the micro lens sheet MS, the first concave-convex portion 71 and the second concave-convex portion 72 can be easily formed.

As shown in FIG. 15C, vacuum assembly equipment or the like, for example, is used to bond the first substrate 81 to the second substrate 82 under a reduced pressure for providing the second substrate 82 on the body 110w to be processed. A material to be the intermediate layer 60 is filled in a gap between the first major surface 81a and the second major surface 82a under a reduced pressure, for example, to form the intermediate layer 60 between the second substrate 82 and the stacked body 50.

As described above, in the organic electroluminescent device 110, a material is filled between the first major surface 81a and the second major surface 82a to form the intermediate layer 60. Therefore, in the organic electroluminescent device 110, the manufacturing process steps can be simplified as compared with the case of forming a planarization layer or the like to fill the projections and depressions 72a, for example.

In bonding the first substrate 81 to the second substrate 82, an ultraviolet cured resin or the like to be the sealing portion 86 is applied in advance to the first major surface 81a or the outer edge portion 83 of the second major surface 82a, for example. As described above, the first substrate 81 is bonded to the second substrate 82 to form the intermediate layer 60 between the second substrate 82 and the stacked body 50, ultraviolet rays are applied to the ultraviolet cured resin, which is applied in advance, to cure the ultraviolet cured resin, for example, and the sealing portion 86 is formed to bond the first substrate 81 to the second substrate 82 through the sealing portion 86.

As described above, the organic electroluminescent device 110 is fabricated.

In the manufacture of the organic electroluminescent device 111, the third electrode 30 is formed on the second electrode 20, and the organic light emitting layer 40 is formed on the third electrode 30. In the manufacture of the organic electroluminescent device 112, the stacked body 50 is formed, and then the protection film 66 is formed. In the manufacture of the organic electroluminescent device 113, forming the second concave-convex portion 72 is omitted. In forming the organic electroluminescent device 114, a substrate having the first concave-convex portion 71 and the second concave-convex portion 72 is used for the second substrate. In the manufacture of the organic electroluminescent device 115, the second electrode 20 is formed in a shape having the opening 22. In the manufacture of the organic electroluminescent device 116, the second electrode 20 is formed in a shape having the opening 22 as well as the first concave-convex portion 71 and the second concave-convex portion 72 are formed at locations opposing the second electrode 20.

Figure 16A:
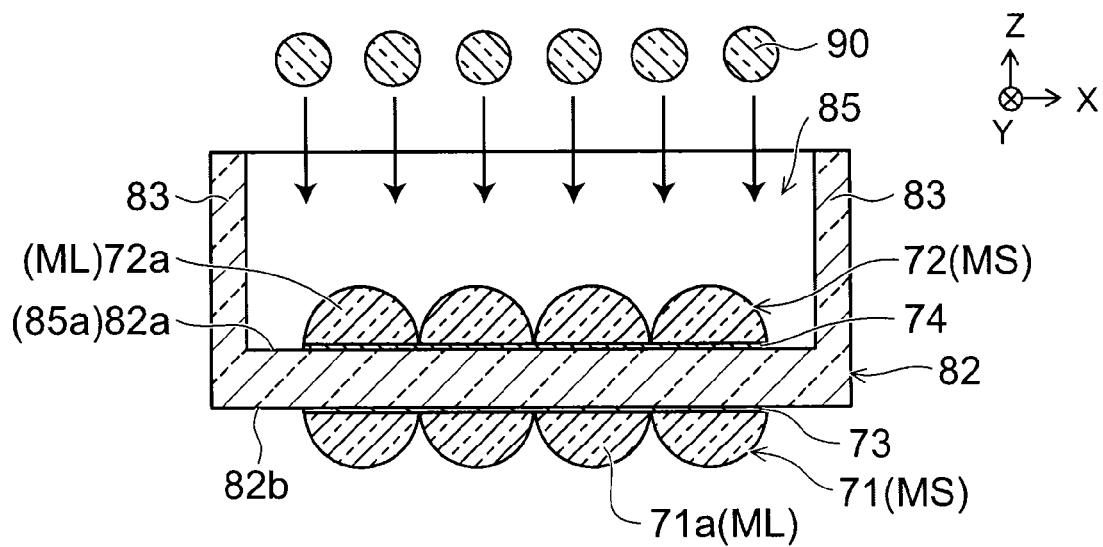
FIG. 16A and FIG. 16B are schematic cross-sectional views illustrating the process steps of another method for manufacturing the organic electroluminescent device according to the third embodiment.
Figure 16B:
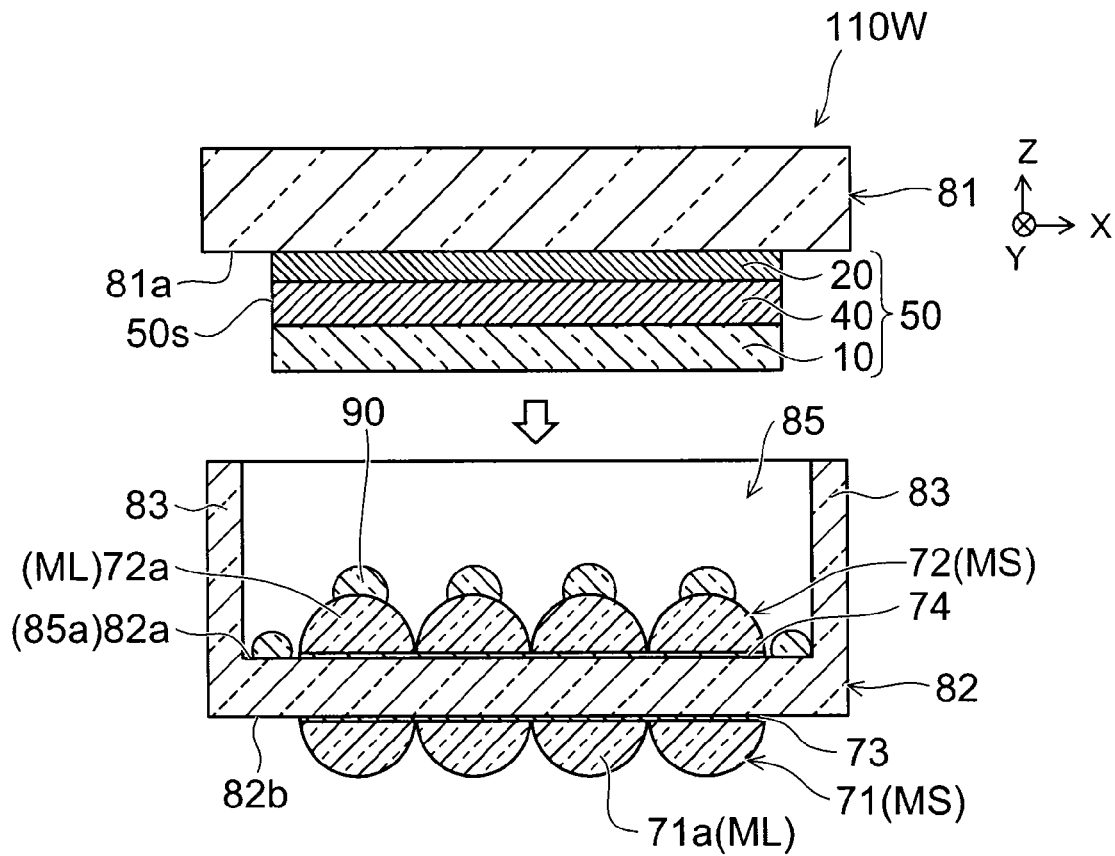

FIG. 16A and FIG. 16B are schematic cross-sectional views illustrating the process steps of another method for manufacturing the organic electroluminescent device according to the third embodiment.

As shown in FIG. 16A, after preparing the second substrate 82 formed with the first concave-convex portion 71 and the second concave-convex portion 72, a droplet 90 to be the material of the intermediate layer 60 is dropped onto the second major surface 82a of the second substrate 82 by ODF (One Drop Fill), for example.

As shown in FIG. 16B, the body 110w to be processed is prepared in advance and placed on the second substrate 82, onto which the droplet 90 is dropped, and the first substrate 81 is bonded to the second substrate 82. As described above, a material to be the intermediate layer 60 may be applied on the second substrate 82 side.

Figure 17:
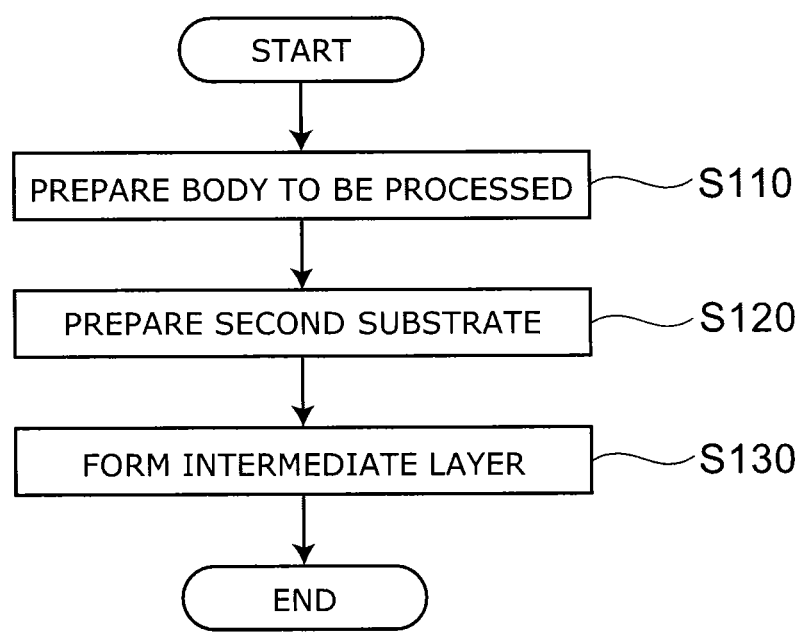
FIG. 17 is a flowchart illustrating a method for manufacturing the organic electroluminescent device according to the third embodiment.

FIG. 17 is a flowchart illustrating a method for manufacturing the organic electroluminescent device according to the third embodiment.

As shown in FIG. 17, the method for manufacturing the organic electroluminescent device 110 according to the embodiment includes Step S110 of preparing the body 110w to be processed, Step S120 of preparing the second substrate 82, and Step S130 of forming the intermediate layer 60. Preparing the body 110w to be processed includes forming the body 110w to be processed as well as preparing the body 110w to be processed in a state in which the body 110w to be processed formed in advance is usable for manufacturing the organic electroluminescent device 110, for example. Preparing the second substrate 82 includes forming the second substrate 82 as well as preparing the second substrate 82 in a state in which the second substrate 82 formed in advance is usable for manufacturing the organic electroluminescent device 110. Preparing the component in a state in which the component is usable for the organic electroluminescent device 110 is a process of removing the protection film that covers and protects the body 110w to be processed from the air or the like, for example. For example, the process is a process of unloading the body 110w to be processed or unloading the second substrate 82 out of a nitrogen filled environment. For example, the process is a process of loading the body 110w to be processed or loading the second substrate 82 in a semiconductor manufacture apparatus such as a vacuum assembly equipment.

In Step S110, the process described with reference to FIG. 15A is performed, for example. In Step S120, the process described with reference to FIG. 15B is performed, for example. In Step S130, the process described with reference to FIG. 15C is performed, for example. In Step S130, the processes described with reference to FIG. 16A and FIG. 16B may be performed, for example.

Accordingly, the organic electroluminescent device 110 with a high luminous efficiency is manufactured.

According to the embodiment, an organic electroluminescent device with a high luminous efficiency, a luminaire device, and a method for manufacturing the organic electroluminescent device are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification of the application, a state in which "a component is provided on another component" includes a state in which a component is directly provided on another component as well as a state in which a component is provided on another component with a different element inserted between the component and another component.

As described above, the embodiments of the invention are described with reference to specific examples. However, the embodiments of the invention are not limited to these specific examples. For example, the specific configurations of the components such as the first substrate, the first concave-convex portion, the second substrate, the first electrode, the second electrode, the organic light emitting layer, the stacked body, the intermediate layer, the second concave-convex portion, the third electrode, the outer edge portion, the inner side portion, the resin portion, the high refractive index particle, the hygroscopic particle, and the body to be processed included in the organic electroluminescent device and the power supply unit or the like included in the luminaire device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all organic electroluminescent devices, luminaire devices, and methods for manufacturing organic electroluminescent device practicable by an appropriate design modification by one skilled in the art based on the organic electroluminescent devices, the luminaire devices, and the methods for manufacturing organic electroluminescent device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device comprising:
   a first substrate having a first surface;
   a second substrate having a second surface facing the first surface and a third surface provided opposite to the second surface, the third surface having a first concave-convex portion, the second substrate being light transmissive, the second surface including a second concave-convex portion having a height 1 μm or more 50 μm or less;
   a sealing portion provided between the first substrate and the second substrate;
   a stacked body provided in a space sealed by the first substrate and the second substrate and the sealing portion, the stacked body including:
      a first electrode, the first electrode being light transmissive;
      a second electrode provided between the first substrate and the first electrode, the second electrode being light reflective; and
      an organic light emitting layer provided between the first electrode and the second electrode; and
   an intermediate layer provided between the second substrate and the stacked body, the intermediate layer extending between the sealing portion and the stacked body, an absolute value of a difference between a refractive index of the intermediate layer and a refractive index of the first electrode being smaller than an absolute value of a difference between a refractive index of the second substrate and a refractive index of the first electrode,
   a distance between the second surface and the stacked body along a direction perpendicular to the first surface being 2 μm or more 500 μm or less.

2. The device according to claim 1, wherein the stacked body further includes a third electrode provided between the second electrode and the organic light emitting layer, and the third electrode is light transmissive.

3. The device according to claim 2, wherein a thickness of the third electrode is 10 nm or more and 1,000 nm or less.

4. The device according to claim 1, wherein
   the second substrate has an outer edge portion and an inner side portion in the outer edge portion,
   the second surface is recessed in the inner side portion, and
   at least a part of the outer edge portion opposes a side face of the stacked body.

5. The device according to claim 4, wherein a distance between the side face of the stacked body and the outer edge portion is 5 μm or more and 1,000 μm or less.

6. The device according to claim 1, wherein the intermediate layer includes a resin portion and a plurality of high refractive index particles dispersed in the resin portion and having a refractive index higher than a refractive index of the resin portion.

7. The device according to claim 6, wherein the intermediate layer further includes a plurality of hygroscopic particles dispersed in the resin portion and having hygroscopic properties.

8. The device according to claim 1, further comprising a protection film provided between the stacked body and the intermediate layer.

9. The device according to claim 1, wherein
   the second electrode is provided in plurality, and
   the second electrodes are disposed apart from each other.

10. The device according to claim 9, wherein
    the third surface has a first portion and a second portion, the first portion is individually overlapping with the second electrodes when projected onto a plane parallel with the first surface, and the second portion is not overlapping with the second electrodes, and
    the first concave-convex portion is provided on the first portion.

11. The device according to claim 1, wherein the first concave-convex portion is a micro lens sheet provided with a plurality of hemispheric micro lenses.

12. The device according to claim 11, further comprising an adhesive layer provided between the first concave-convex portion and the second substrate.

13. The device according to claim 11, wherein a height of the micro lenses is 1 μm or more 50 μm or less.

14. The device according to claim 11, wherein a density of the micro lenses per unit area is 40% or more.

15. The device according to claim 1, wherein the first electrode includes an oxide including at least one element selected from a group consisting of In, Sn, Zn, and Ti.

16. The device according to claim 1, wherein the second electrode includes at least one of aluminum and silver.

17. A luminaire device comprising:
an organic electroluminescent device including:
   a first substrate having a first surface;
   a second substrate having a second surface facing the first surface and a third surface provided opposite the second surface, the third surface having a first concave-convex portion, the second substrate being light transmissive, the second surface having a second concave-convex portion, a height of the second concave-convex portion being 1 μm or more 50 μm or less;
   a sealing portion provided between the first substrate and the second substrate;
   a stacked body provided in a space sealed by the first substrate and the second substrate and the sealing portion, the stacked body including:
      a second electrode provided between the first substrate and the first electrode, the second electrode being light reflective; and
      an organic light emitting layer provided between the first electrode and the second electrode; and
   an intermediate layer provided between the second substrate and the stacked body, the intermediate layer extending between the sealing portion and the stacked body, an absolute value of a difference between a refractive index of the intermediate layer and a refractive index of the first electrode being smaller than an absolute value of a difference between a refractive index of the second substrate and a refractive index of the first electrode; and
a power supply unit electrically connected to the first electrode and the second electrode and configured to supply a current to the organic light emitting layer through the first electrode and the second electrode,
a distance between the second surface and the stacked body along a direction perpendicular to the first surface being 2 μm or more 500 μm or less.

18. A method for manufacturing an organic electroluminescent device comprising:
preparing a body to be processed, the body including:
   a first substrate having a first surface; and
   a stacked body provided on the first substrate, the stacked body including a first electrode, a second electrode, and an organic light emitting layer, the first electrode being light transmissive, the second electrode being light reflective, the second electrode provided between the first substrate and the first electrode, the organic light emitting layer provided between the first electrode and the second electrode;
preparing a second substrate having a second surface and a third surface provided opposite the second surface, the third surface having a first concave-convex portion, the second substrate being light transmissive, the second surface having a second concave-convex portion, a height of the second concave-convex portion being 1 μm or more 50 μm or less; and
opposing the second substrate to the body to be processed so as to oppose the second surface to the first surface, setting a distance between the second surface and the stacked body along a direction perpendicular to the first surface into 2 μm or more 500 μm or less, forming a sealing portion between the first substrate and the second substrate, sealing the stacked body by the first substrate and the second substrate and the sealing portion, forming an intermediate layer between the second substrate and the stacked body, and extending the intermediate layer between the sealing portion and the stacked body, an absolute value of a difference between a refractive index of the intermediate layer and a refractive index of the first electrode being smaller than an absolute value of a difference between a refractive index of the second substrate and a refractive index of the first electrode.

* * * * *